(12) United States Patent
Ota et al.

(10) Patent No.: US 11,867,610 B2
(45) Date of Patent: *Jan. 9, 2024

(54) DYNAMIC HIGH-SPEED HIGH-SENSITIVITY IMAGING DEVICE AND IMAGING METHOD

(71) Applicants: The University of Tokyo, Tokyo (JP); Osaka University, Osaka (JP)

(72) Inventors: Sadao Ota, Tokyo (JP); Ryoichi Horisaki, Osaka (JP); Kazuki Hashimoto, Tokyo (JP)

(73) Assignees: The University of Tokyo, Tokyo (JP); Osaka University, Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 18/152,354

(22) Filed: Jan. 10, 2023

(65) Prior Publication Data
US 2023/0288318 A1    Sep. 14, 2023

Related U.S. Application Data

(63) Continuation of application No. 17/336,720, filed on Jun. 2, 2021, now Pat. No. 11,579,075, which is a (Continued)

(30) Foreign Application Priority Data

Feb. 24, 2015   (JP) .................. 2015-033520

(51) Int. Cl.
*G01J 3/00*    (2006.01)
*G01N 21/01*    (2006.01)
(Continued)

(52) U.S. Cl.
CPC ............. *G01N 21/01* (2013.01); *G01B 11/00* (2013.01); *G01N 21/53* (2013.01); *G01N 21/59* (2013.01);
(Continued)

(58) Field of Classification Search
None
See application file for complete search history.

(56) References Cited

U.S. PATENT DOCUMENTS

| | | | |
|---|---|---|---|
| 4,537,861 A | 8/1985 | Elings et al. | |
| 5,483,469 A | 1/1996 | Van den Engh et al. | |

(Continued)

FOREIGN PATENT DOCUMENTS

| | | | |
|---|---|---|---|
| CN | 1330151 A | 1/2002 | |
| CN | 101925809 A | 12/2010 | |

(Continued)

OTHER PUBLICATIONS

CN201680011390X Chinese Search Report dated Mar. 1, 2019.
(Continued)

*Primary Examiner* — David P Porta
*Assistant Examiner* — Mamadou Faye
(74) *Attorney, Agent, or Firm* — Wilson Sonsini Goodrich & Rosati

(57) ABSTRACT

Any one or both of an optical system with a structured lighting pattern and a structured detecting system having a plurality of regions with different optical characteristics are used. In addition, optical signals from an object to be observed through one or a small number of pixel detectors are detected while changing relative positions between the object to be observed and any one of the optical system and the detecting system, time series signal information of the optical signals are obtained, and an image associated with an object to be observed from the time series signal information is reconstructed.

17 Claims, 19 Drawing Sheets

Related U.S. Application Data continuation of application No. 16/936,138, filed on Jul. 22, 2020, now Pat. No. 11,054,363, which is a continuation of application No. 15/552,438, filed as application No. PCT/JP2016/055412 on Feb. 24, 2016, now Pat. No. 10,761,011.

(51) Int. Cl.
*G01B 11/00* (2006.01)
*G01N 21/64* (2006.01)
*H03M 7/30* (2006.01)
*G01N 21/53* (2006.01)
*G01N 21/59* (2006.01)

(52) U.S. Cl.
CPC ......... *G01N 21/64* (2013.01); *G01N 21/6456* (2013.01); *H03M 7/3062* (2013.01)

(56) References Cited

U.S. PATENT DOCUMENTS

| | | | |
|---|---|---|---|
| 6,064,473 A | 5/2000 | Hironaga et al. | |
| 7,217,573 B1 | 5/2007 | Oshida et al. | |
| 7,812,303 B2 | 10/2010 | Meyers et al. | |
| 9,360,660 B2 | 6/2016 | Yi et al. | |
| 9,645,377 B2 | 5/2017 | Bosworth et al. | |
| 10,761,011 B2 | 9/2020 | Ota et al. | |
| 11,054,363 B2 | 7/2021 | Ota et al. | |
| 11,098,275 B2 | 8/2021 | Ota et al. | |
| 11,542,461 B2 | 1/2023 | Ota et al. | |
| 11,579,075 B2 * | 2/2023 | Ota ........................ | G01B 11/00 |
| 2002/0041376 A1 | 4/2002 | Kurozumi et al. | |
| 2005/0002030 A1 | 1/2005 | Kolp et al. | |
| 2005/0046849 A1 | 3/2005 | Cromwell et al. | |
| 2005/0051466 A1 | 3/2005 | Carter et al. | |
| 2007/0091315 A1 | 4/2007 | Brady et al. | |
| 2007/0151343 A1 | 7/2007 | Gross et al. | |
| 2009/0093807 A1 | 4/2009 | Hyde et al. | |
| 2009/0153883 A1 | 6/2009 | Shinoda | |
| 2009/0190121 A1 | 7/2009 | Hegyi et al. | |
| 2009/0194702 A1 | 8/2009 | Meyers et al. | |
| 2010/0170796 A1 | 7/2010 | Bhatia et al. | |
| 2010/0284016 A1 | 11/2010 | Teitell et al. | |
| 2010/0294916 A1 | 11/2010 | Meyers et al. | |
| 2012/0004514 A1 | 1/2012 | Marugame | |
| 2012/0069170 A1 | 3/2012 | Gesley | |
| 2012/0122084 A1 | 5/2012 | Wagner et al. | |
| 2012/0128264 A1 | 5/2012 | Yazdanfar et al. | |
| 2013/0078733 A1* | 3/2013 | Holmes ............... | B01L 3/50825 422/524 |
| 2013/0155499 A1 | 6/2013 | Dixon et al. | |
| 2013/0200277 A1 | 8/2013 | Li et al. | |
| 2013/0204538 A1 | 8/2013 | Rich | |
| 2014/0073000 A1 | 3/2014 | Sun et al. | |
| 2014/0078352 A1* | 3/2014 | Iwai .................... | H04N 23/81 348/241 |
| 2014/0098359 A1 | 4/2014 | Gross et al. | |
| 2014/0152801 A1 | 6/2014 | Fine et al. | |
| 2014/0236494 A1 | 8/2014 | Kolandaivelu et al. | |
| 2014/0376816 A1 | 12/2014 | Lagae et al. | |
| 2015/0198584 A1 | 7/2015 | Rajwa et al. | |
| 2015/0268244 A1 | 9/2015 | Cho et al. | |
| 2015/0276387 A1 | 10/2015 | Kletter et al. | |
| 2015/0377783 A1 | 12/2015 | Kumer | |
| 2016/0033328 A1 | 2/2016 | Walters | |
| 2016/0223453 A1 | 8/2016 | Jalali et al. | |
| 2016/0231549 A1* | 8/2016 | Bosworth .......... | G02B 21/0032 |
| 2016/0327779 A1 | 11/2016 | Hillman et al. | |
| 2017/0052106 A1 | 2/2017 | Hennig et al. | |
| 2017/0227466 A1 | 8/2017 | Lo et al. | |
| 2017/0322137 A1 | 11/2017 | Feher et al. | |
| 2018/0127823 A1 | 5/2018 | Shekhar et al. | |
| 2021/0190669 A1 | 6/2021 | Ota et al. | |

FOREIGN PATENT DOCUMENTS

| | | |
|---|---|---|
| CN | 102272580 A | 12/2011 |
| CN | 102495467 A | 6/2012 |
| CN | 102890049 A | 1/2013 |
| CN | 103604737 A | 2/2014 |
| CN | 103837461 A | 6/2014 |
| CN | 103930768 A | 7/2014 |
| CN | 104136907 A | 11/2014 |
| CN | 104154878 A | 11/2014 |
| CN | 104736995 A | 6/2015 |
| CN | 105579828 A | 5/2016 |
| CN | 105651656 A | 6/2016 |
| CN | 105849275 A | 8/2016 |
| EP | 2602612 A1 | 6/2013 |
| EP | 2673618 A1 | 12/2013 |
| EP | 3264031 A1 | 1/2018 |
| EP | 3372985 A1 | 9/2018 |
| EP | 3807005 A1 | 4/2021 |
| JP | S613032 A | 1/1986 |
| JP | S6279329 A | 4/1987 |
| JP | H01118747 A | 5/1989 |
| JP | H07270314 A | 10/1995 |
| JP | H07325026 A | 12/1995 |
| JP | H09311102 A | 12/1997 |
| JP | 2002116133 A | 4/2002 |
| JP | 3444509 B2 | 9/2003 |
| JP | 2006520893 A | 9/2006 |
| JP | 2008523402 A | 7/2008 |
| JP | 2009115672 A | 5/2009 |
| JP | 2009180724 A | 8/2009 |
| JP | 2009180725 A | 8/2009 |
| JP | 2010203949 A | 9/2010 |
| JP | 2013015357 A | 1/2013 |
| JP | 2013178232 A | 9/2013 |
| JP | 5534214 B2 | 6/2014 |
| JP | 2014175819 A | 9/2014 |
| WO | WO-2006103920 A1 | 10/2006 |
| WO | WO-2006127967 A2 | 11/2006 |
| WO | WO-2007067999 A2 | 6/2007 |
| WO | WO-2011049965 A1 | 4/2011 |
| WO | WO-2012068287 A2 | 5/2012 |
| WO | WO-2012086195 A1 | 6/2012 |
| WO | WO-2012144886 A1 | 10/2012 |
| WO | WO-2012147804 | 11/2012 |
| WO | WO-2014146062 A2 | 9/2014 |
| WO | WO-2016085571 A2 | 6/2016 |
| WO | WO-2016136801 A1 | 9/2016 |
| WO | WO-2017046988 A1 | 3/2017 |
| WO | WO-2017073737 A1 | 5/2017 |
| WO | WO-2019241443 A1 | 12/2019 |

OTHER PUBLICATIONS

CN201680062987.7 Office Action dated Dec. 30, 2019.
EP16755545.7 European Office Action dated Jun. 24, 2020.
EP16755545.7 Extended European Search Report dated Aug. 24, 2018.
EP16859965.2 European Search Report dated Aug. 16, 2019.
EP16859965.2 European Search Report dated May 6, 2019.
EP16859965.2 Office Action dated Jul. 18, 2022.
EP19819019.1 Extended European Search Report dated Feb. 8, 2022.
Han, et al., Imaging cells in flow cytometer using spatial-temporal transformation. Scientific Reports, Aug. 18, 2015; vol. 5, No. 1: XP055477357.
International Search Report of PCT/JP2016/055412, dated May 17, 2016.
International Search Report of PCT/JP2016/082089, dated Jan. 24, 2017.
Japanese Application No. 2017-547891 Office Action dated Oct. 6, 2020.
JP2017-547891 Japanese Office Action dated Apr. 27, 2021.
JP2021-159163 Japanese Office Action dated Oct. 4, 2022.
Katz, et al. Compressive ghost imaging. Appl. Phys. Lett. 95, 131110 (2009).

(56) References Cited

OTHER PUBLICATIONS

Li, et al., Ghost imaging for an axially moving target with an unknown constant speed, Photonics Research, Aug. 2015; 3(4):153-157.
Li, et al., Ghost imaging of a moving target with an unknown constant speed, Applied Physics Letters, 2014; 104:251120-1-251120-3.
PCT/US2019/036849 International Search Report and Written Opinion dated Sep. 19, 2019.
Shibuya, et al., Monomolecular fluorescence imaging method based on ghost imaging by using circulatory pattern (second report), 2014: 863-864.
Ugawa M, Lei C, Nozawa T, Ideguchi T, Di Carlo D, Ota S, Ozeki Y, Goda K. High-throughput optofluidic particle profiling with morphological and chemical specificity. Opt Lett. Oct. 15, 2015;40(20):4803-6. doi: 10.1364/OL.40.004803. PMID: 26469624.
Zhang, et al., Study on ghost imaging via compressive sensing for a reflected object, Optik, 2013;124:2334-2338.
Co-pending U.S. Appl. No. 18/059,846, inventors Sadao; Ota et al., filed Nov. 29, 2022.
U.S. Appl. No. 17/115,657 Notice of Allowance dated Jun. 14, 2023.
U.S. Appl. No. 18/059,846 Office Action dated May 17, 2023.

\* cited by examiner

FIG. 12

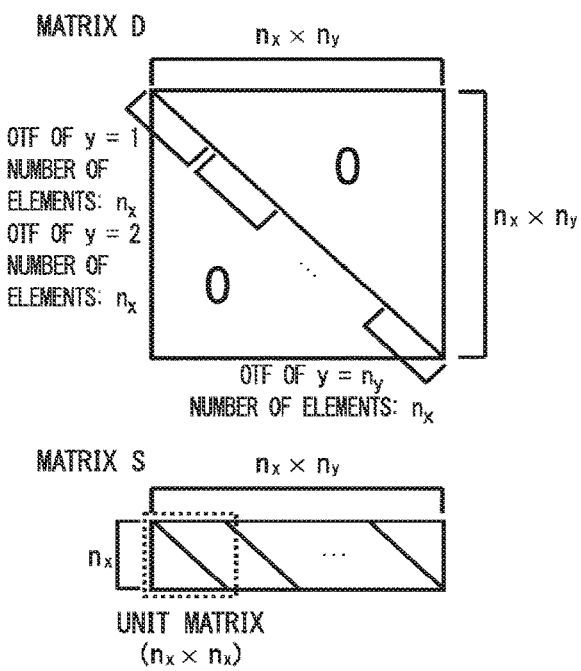

$H = F^{-1}SDF$
F: FOURIER TRANSFORM
D: MULTIPLY optical transfer function (OTF) MATRIX IN WHICH x ROWS OF STRUCTURED LIGHTING IS SUBJECT TO FOURIER TRANSFORM AND ARE ARRANGED IN DIAGONAL ELEMENTS
S: INTEGRATE y DIMENSION
$F^{-1}$: INVERSE FOURIER TRANSFORM $H^T = (F^{-1}SOF)^T = F^{-1}O*S^TF$
$H^T$: TRANSPOSED MATRIX OF H
F: FOURIER TRANSFORM
$S^T$: DUPLICATE VECTOR IN y DIMENSION
D*: CONJUGATE COMPLEX OF D
$F^{-1}$: INVERSE FOURIER TRANSFORM

DYNAMIC HIGH-SPEED HIGH-SENSITIVITY IMAGING DEVICE AND IMAGING METHOD

CROSS-REFERENCE

This application is a continuation application of U.S. Non-Provisional patent application Ser. No. 17/336,720, filed Jun. 2, 2021, now U.S. Pat. No. 11,579,075, which is a continuation U.S. Non-Provisional patent application Ser. No. 16/936,138, filed Jul. 22, 2020, now U.S. Pat. No. 11,054,363, which is a continuation application of U.S. Non-Provisional patent application Ser. No. 15/552,438, filed Aug. 21, 2017, now U.S. Pat. No. 10,761,011, which is a 35 USC § 371 United States national stage application of International Application No. PCT/JP2016/055412, filed Feb. 24, 2016, which claims priority to Japanese Application No. 2015-033520, filed Feb. 24, 2015, each of which is entirely incorporated herein by reference.

TECHNICAL FIELD

The present invention relates to dynamic high-speed high-sensitivity imaging technology in which an object to be observed and a detecting system having an optical system or a structure configured to project structured lighting are relatively displaced.

BACKGROUND ART

Japanese Unexamined Patent Application, First Publication No. 2014-175819 (Patent Literature 1) discloses an imaging system including electromagnetic wave detecting elements arranged in a two-dimensional array. In an imaging device using array type detecting elements, there are limitations on an imaging speed thereof from electrical restrictions when the elements are operated and a problem in that the imaging device is expensive and large in size.

Published Japanese Translation No. 2006-520893 of the PCT International Publication (Patent Literature 2) discloses a device using a single pixel detector. Furthermore, Japanese Patent No. 3444509 (Patent Literature 3) discloses an image reading device having single pixel detectors. An imaging device configured to perform single pixel detection needs to spatiotemporally structure illumination light to capture an image. For this reason, mechanical/electrical constraints involved in spatiotemporally changing illumination light occur and there are limitations on an imaging speed in the imaging device configured for single pixel detection.

For example, there are limitations on a speed of mechanically performing spatial-scanning with a laser in a confocal microscope and an image cannot be captured at high speed. Ghost imaging is a method in which numerous different structural lightings are radiated using a spatial light modulator or the like, detection is iterated, and an image is reconstructed. In such a method, since a speed of radiating lighting serves as a constraint, imaging is slow.

Japanese Unexamined Patent Application, First Publication No. 2013-15357 (Patent Literature 4) discloses a flow cytometer using serial time-encoded amplified microscopy (STEAM). In this publication, laser pulses with sufficiently wide wavelength widths are emitted from a laser irradiating unit at constant time intervals and the laser pulses are two-dimensionally dispersed by a two-dimensional spatial disperser. Different positions on a sample are irradiated with laser beams with wavelengths dispersed by the two-dimensional spatial disperser and the laser beams are reflected. The reflected laser beams with these wavelengths reversely pass through the two-dimensional spatial disperser so that the reflected laser beams return to one pulse. Such a pulse passes through a Fourier transform, a frequency component is converted into a time, and then the pulse is detected by a photodiode. In a continuous time encoding amplitude microscope method, since a frequency (a wavelength) corresponds to a position on a sample and a frequency component is converted into a time, the time has information of the position on the sample. In other words, a two-dimensional intensity distribution is converted into a time series. Information on surface structures of particles to be tested can be obtained from a temporal change in intensity signals of pulses acquired in this way.

In a serial time-encoded amplified microscopy (STEAM), repetition on frequency of a pulsed laser becomes constraints. Furthermore, an imaging device using STEAM is very expensive and large in size, an applicable light wavelength range is limited to long wavelengths, and thus it is difficult to achieve high sensitivity in a visible light range. For this reason, there is a problem in that STEAM cannot be applied to a visible fluorescence wavelength region necessary for application to the fields of life sciences/medicine.

CITATION LIST

Patent Literature

[Patent Literature 1]
  Japanese Unexamined Patent Application, First Publication No. 2014-175819
[Patent Literature 2]
  Published Japanese Translation No. 2006-520893 of the PCT International Publication
[Patent Literature 3]
  Japanese Patent No. 3444509
[Patent Literature 4]
  Japanese Unexamined Patent Application, First Publication No. 2013-15357

SUMMARY OF INVENTION

Technical Problem

Thus, the present invention is for the purpose of providing a high-speed, high-sensitivity, low-cost, and compact imaging device.

Solution to Problem

A first aspect of the present invention relates to a high-speed imaging method. The method includes using any one or both of an optical system with a structured lighting pattern and a structured detecting system having a plurality of regions with different optical characteristics. Also, the method includes detecting optical signals from an object to be observed through one or a small number of pixel detectors while changing relative positions between the object to be observed and any one of the optical system and the detecting system, obtaining time series signal information of the optical signals, and reconstructing an image associated with an object to be observed from the time series signal information.

A second aspect of the present invention relates to an imaging device.

A first embodiment of the imaging device relates to an imaging device having an optical system with a structured lighting pattern.

The imaging device has an optical system (11), one or a small number of pixel detectors (15), a relative position control mechanism (17), and an image reconstructing unit (19).

The optical system (11) is an optical system with a structured lighting pattern having a plurality of regions with different optical characteristics.

The one or a small number of pixel detectors (15) is a detecting element configured to detect optical signals emitted by an object to be observed (13) receiving light discharged from the optical system (11).

The relative position control mechanism (17) is a mechanism configured to change relative positions between the optical system (11) and the object to be observed (13).

The image reconstructing unit (19) is an element configured to reconstruct an image of an object to be observed using optical signals detected by the one or a small number of pixel detectors (15).

The optical system (11) with a structured lighting pattern has a plurality of regions with different optical characteristics.

Examples of the optical signals include fluorescence, emitted light, transmitted light, or reflected light, but the present invention is not limited thereto.

Examples of the optical characteristics include one or more characteristics (for example, transmission characteristics) of a light intensity, a light wavelength, and polarization, but the present invention is not limited thereto.

Examples of the relative position control mechanism (17) include a mechanism configured to change a position of the object to be observed (13) or a mechanism configured to change a position of the optical system (11).

Examples of the image reconstructing unit (19) include an element configured to reconstruct an image of an object to be observed using optical signals detected by one or a small number of pixel detectors (15) and information associated with a plurality of regions included in the optical system (11) with the structured lighting pattern.

An imaging device of a second embodiment relates to one or a small number of pixel detectors (55) having a plurality of regions with different optical characteristics.

The imaging device has an optical system (51), one or a small number of pixel detectors (55), a relative position control mechanism (57), and an image reconstructing unit (59).

The optical system (51) is an element configured to irradiate an object to be observed with light.

One or a small number of pixel detectors (55) are elements configured to detect optical signals emitted by the object to be observed (53) receiving light discharged from the optical system (51).

The relative position control mechanism (57) is a mechanism configured to change relative positions between the optical system (51) and the object to be observed (53) or relative positions between the object to be observed (53) and the one or a small number of pixel detectors (55).

The image reconstructing unit (59) is an element configured to reconstruct an image of an object to be observed using optical signals detected by one or a small number of pixel detectors (55).

Examples of the relative position control mechanism (57) include a mechanism configured to change a position of the object to be observed (53) or a mechanism configured to change a position of the one or a small number of pixel detectors (55).

An example of the image reconstructing unit (59) is an element configured to reconstruct an image of an object to be observed using optical signals detected by the one or a small number of pixel detectors (55) and information associated with a plurality of regions included in the one or a small number of pixel detectors (57).

Advantageous Effects of Invention

According to the present invention, a high-speed imaging device which can fully utilize a band (a signal detection limit speed) of a single or non-array type high-speed/high-sensitivity detectors in the world for the first time (if a capacity is GHz or less, $10^9$ sheets (lines)/second) and greatly exceeds the speed limit of continuous imaging technology in the related art can be provided.

According to the present invention, general-purpose and various types of high-sensitivity imaging including visible fluorescence imaging which was impossible in imaging methods using a single pixel detector in the related art can be performed using a universal optical system. Also, according to the present invention, since a simple optical system can be adopted, hardly any optical signal is lost and hardly any noise is introduced. Thus, imaging with a high signal-to-noise (S/N) ratio can be performed.

According to the present invention, since an optical system and an electrical system which are used are simple, costs can be greatly decreased and compactness can be achieved as compared with all imaging techniques in the related art.

BRIEF DESCRIPTION OF DRAWINGS

FIG. 12 is a view showing a matrix H.

DESCRIPTION OF EMBODIMENTS

Hereinafter, a form configured to implement the present invention will be described using the drawings. The present invention is not limited to a form which will be described below and also includes forms appropriately modified by a person of ordinary skill in the art in an obvious range from the following form. Note that radio signals, terahertz signals, radio frequency signals, acoustic signals, X-rays, y-rays, particle beams, or electromagnetic waves may be used in place of optical signals which will be described below. In this case, a light source which appropriately uses units configured to generate such signals and has a plurality of regions with different transmission characteristics, reflection characteristics, or the like therefor may be appropriately used in place of the light source described below. Furthermore, as a structured lighting pattern or a structured detecting system, a pattern or a system obtained by using films in which a substance changing transparency such as aluminum, silver, or lead is partially applied or painted can be appropriately adopted.

Figure 1:
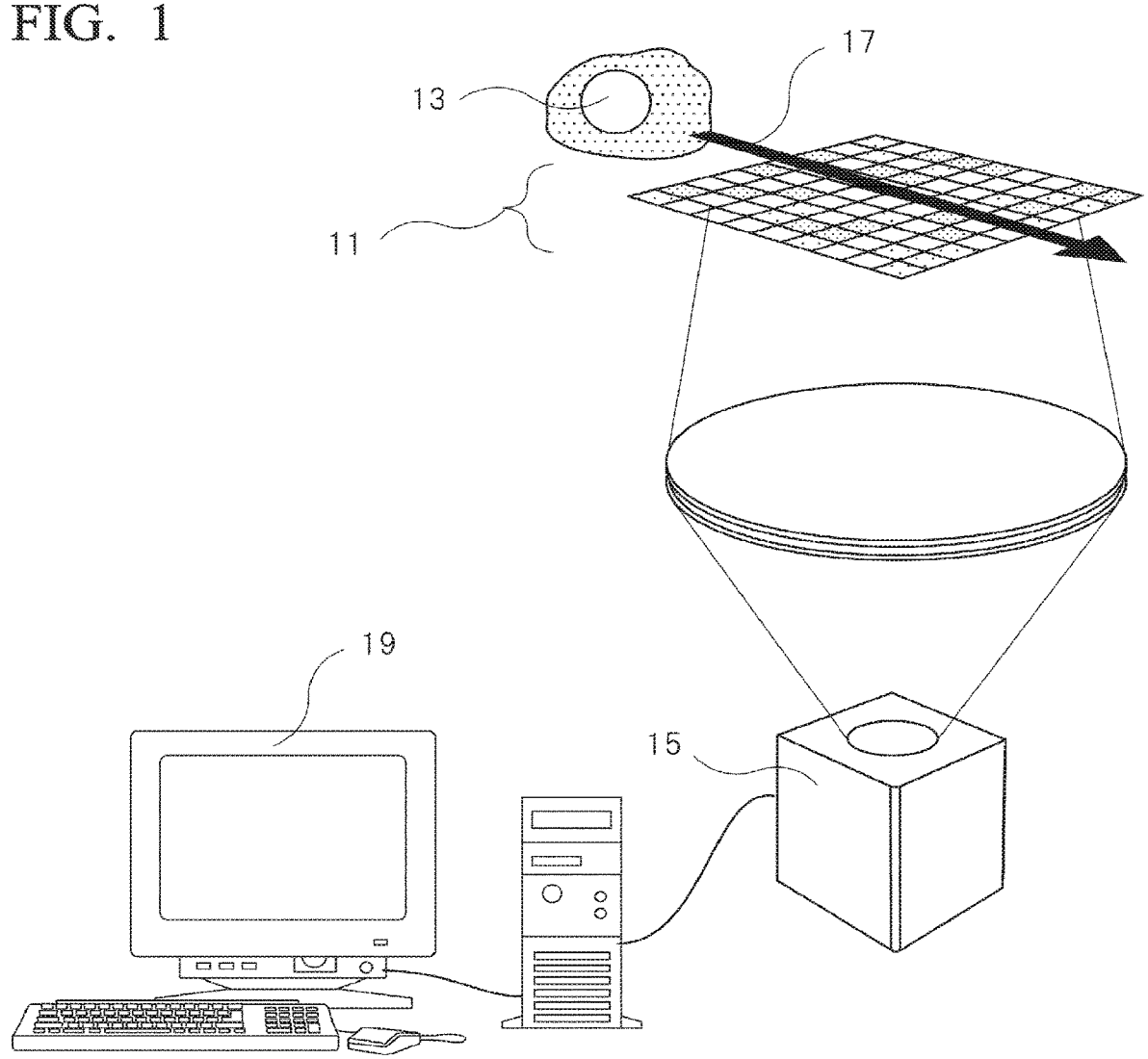
FIG. 1 is a schematic constitution diagram showing that an object to be observed moves in a first embodiment of an imaging device.

FIG. 1 is a schematic constitution diagram showing that an object to be observed moves in a first embodiment of an imaging device. The first embodiment of the imaging device relates to an imaging device having an optical system with a structured lighting pattern. The structured lighting pattern means that there are a plurality of regions with different light characteristics within a region of light with which the object to be observed is irradiated.

As shown in FIG. 1, the imaging device has an optical system 11, one or a small number of pixel detectors 15, a relative position control mechanism 17, and an image reconstructing unit 19.

The optical system 11 is an optical system (a system) including a structured lighting pattern having a plurality of regions with different optical characteristics. The optical system 11 may have a light source (not shown). In other words, examples of the optical system include a group of optical elements having a light source (not shown) and filters configured to receive light from the light source and form a structured lighting pattern. Other examples of the optical system include a group of light sources (or a group of optical elements including a group of light source and optical elements) having a plurality of light sources constituting a lighting pattern. Light from the light source passes through filters with, for example, an shown pattern of optical characteristics and is radiated to an object to be measured to have an shown light pattern. The light source may be continuous light or pulsed light, but is preferably continuous light. The light source may be white light or monochromatic light. Examples of the optical characteristics include characteristics (for example, transmittance) associated with one or more of a light intensity, a light wavelength, and polarization, but the present invention is not limited thereto. Examples of a structured lighting pattern having a plurality of regions with different optical characteristics have a plurality of regions with a first light intensity and a plurality of regions with a second light intensity. Examples of the plurality of regions with different optical characteristics have sites with different light characteristics randomly distributed in a certain region. Furthermore, other examples of the plurality of regions with different optical characteristics include a plurality of regions divided in a lattice shape, in which the plurality of regions have at least regions having the first light intensity and regions having the second light intensity. The structured lighting pattern having the plurality of regions with different optical characteristics can be obtained, for example, by irradiating a transparent file with a pattern printed thereon with light from the light source, in addition to a structured lighting pattern described in examples. Light is radiated to the object to be observed through the structured lighting pattern.

Examples of an object to be observed 13 can include various objects as an object to be observed depending on applications. Examples of the object to be observed include cells, body fluids, and eyeballs (may include moving eyeballs), but the present invention is not limited thereto.

The one or a small number of pixel detectors 15 are detecting elements configured to detect optical signals emitted by the object to be observed 13 receiving light discharged from the optical system 11. Examples of the optical signals includes fluorescence, emitted light, transmitted light, or reflected light. Examples of one or a small number of pixel detectors include a photomultiplier tube and a multi-channel plate photomultiplier tube, but the present invention is not limited thereto. Since a small number of pixel detectors are compact and can operate elements in parallel at high speed, a small number of pixel detectors are preferably used for the present invention. Examples of a single pixel detector are disclosed in Japan Patents Nos. 4679507 and 3444509.

The relative position control mechanism 17 is a mechanism configured to change relative positions between the optical system 11 and the object to be observed 13. Examples of the relative position control mechanism 17 include a mechanism configured to change a position of the object to be observed 13 or a mechanism configured to change a position of the optical system 11. Examples of the mechanism configured to change the position of the object to be observed 13 include a mechanism having a stage on which the object to be observed 13 can be mounted and an actuator configured to move the stage. Examples of the mechanism configured to change the position of the optical system 11 include a mechanism configured to move a portion of the optical system 11 which has a plurality of regions and in which the structured lighting pattern is formed (for example, only the light source, the filter and the light source) using an actuator or the like. The imaging device having the mechanism configured to change the position of the object to be observed 13 can be used for, for example, cell flow cytometry. Furthermore, since the size of the imaging device in this embodiment can be decreased, the imaging device in this embodiment can be used as an imaging device in a wearable device having for example, a person's moving eyes as the object to be observed. The imaging device having the mechanism configured to change the position of the optical system 11 can be used as an imaging device in a microscope. Examples of such a microscope include a point scanning type microscope, a confocal microscope, an electron microscope, a photo-acoustic microscope, and an ultrasonic microscope.

Figure 2:
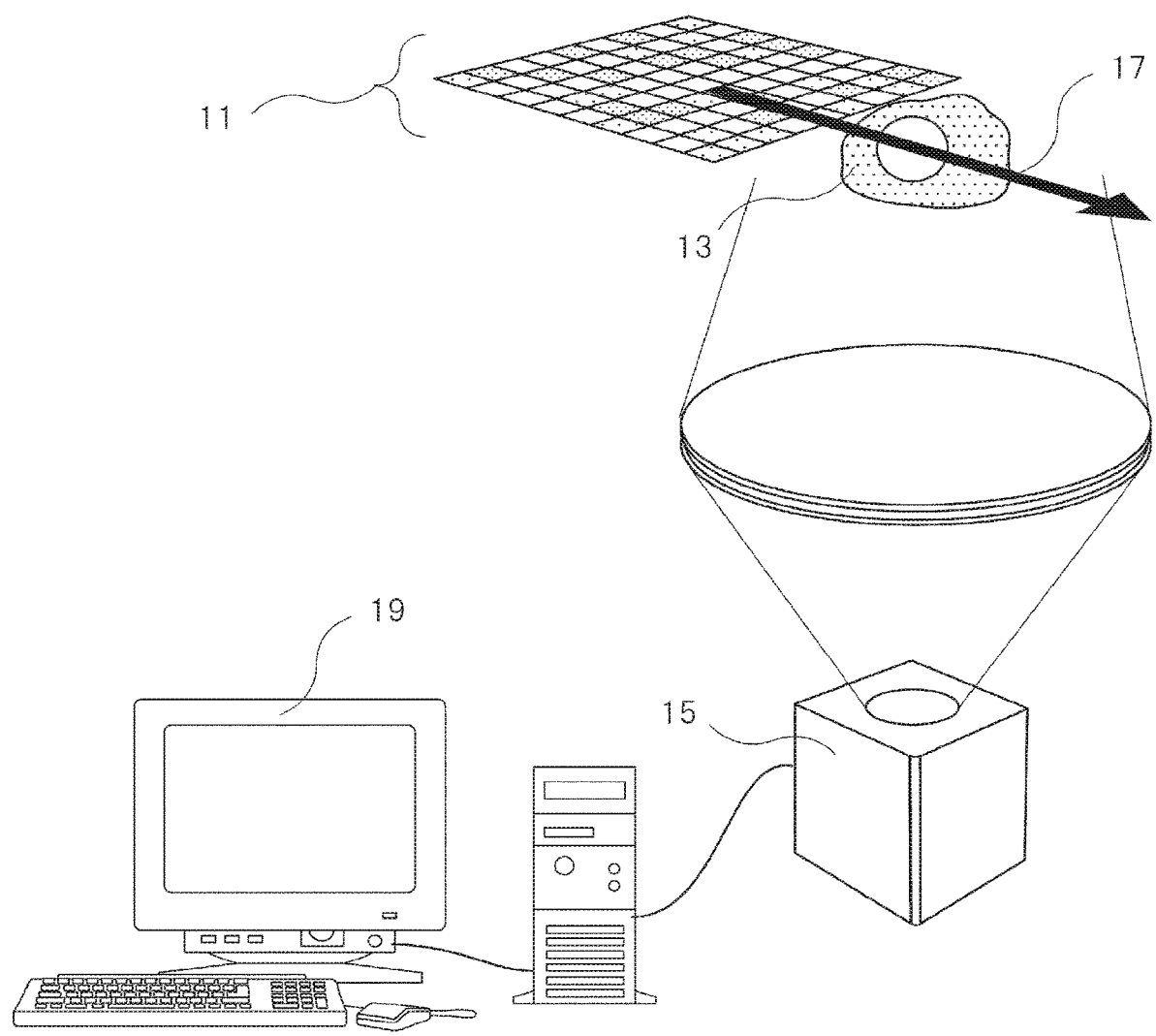
FIG. 2 is a schematic constitution diagram showing that a mechanism configured to change a position of an optical system (11) is provided in the first embodiment of the imaging device.

FIG. 2 is a schematic constitution diagram showing that the mechanism configured to change the position of the optical system 11 is provided in the first embodiment of the imaging device. In an example shown in FIG. 2, patterned lighting is moved so that places in the object to be observed 13 are irradiated with light to have light characteristics according to a pattern of the patterned lighting over time.

The image reconstructing unit 19 is a device configured to reconstruct an image of the object to be observed using optical signals detected by one or a small number of pixel detectors 15. Examples of the image reconstructing unit 19 include an image reconstructing unit configured to reconstruct an image of the object to be observed using fluorescence detected by one or a small number of pixel detectors 15 and information associated with the plurality of regions included in the optical system 11 having the structured lighting pattern.

The image reconstructing unit 19 can be realized using, for example, a control device (for example, a computer) connected to the one or a small number of pixel detectors 15. Such a control device is configured such that an input or output unit, a storage unit, a calculating unit, and a control unit are connected to each other through a bus or the like and thus information can be received or transmitted. Furthermore, the storage unit stores various programs or numerical values such as parameters. When predetermined information is input from the input or output unit, such a control device reads a necessary program and numerical values from the storage unit, and causes the calculating unit to perform predetermined calculation in accordance with the program, to appropriately store calculation results in the storage unit, and to perform an output from the input or output unit.

The image reconstructing unit 19, for example, has a time series signal information acquisition unit configured to receive optical signals for a certain period of time and acquire time series signal information of the optical signals, a partial signal separating unit configured to separate partial time series signal information in a partial region of the object to be observed from the time series signal information, a partial image reconstructing unit configured to extract or reconstruct information associated with images (emitted light intensities or the like) of portions of the object to be observed from the acquired partial the time series signal information of the object to be observed, and an image reconstructing unit configured to reconstruct the image associated with the object to be observed using the images of the portions of the object to be observed which are reconstructed by the partial image reconstructing unit.

Detection signals include information regarding a detected intensity for every temporal change. The time series signal information acquisition unit acquires the optical signals. Examples of the time series signal information acquisition unit include a time series signal information acquisition unit configured to receive detection signals received, detected, and stored by the one or a small number of pixel detectors 15 for a certain period of time as the time series signal information. The time series signal information acquired by the time series signal information acquisition unit may be appropriately stored in the storage unit. Furthermore, the time series signal information acquired by the time series signal information acquisition unit is used for a calculating process using the partial signal separating unit. Thus, the time series signal information may be transferred to the partial signal separating unit.

The partial signal separating unit is an element configured to separate the partial time series signal information in the partial region of the object to be observed from the time series signal information. The time series signal information includes detection signals derived from the portions of the object to be observed. For this reason, the partial signal separating unit separates the partial time series signal information serving as the time series signal information in the partial regions of the object to be observed from the time series signal information. At this time, the partial signal separating unit reads stored information H associated with the lighting pattern and separates the partial time series signal information using the read information H associated with the lighting pattern and the time series signal information. In other words, the time series signal information includes variation corresponding to the information H associated with the lighting pattern. Thus, the time series signal information can be separated into the partial time series signal information using the information H associated with the lighting pattern. The partial time series signal information serving as the time series signal information in the partial regions of the object to be observed may be appropriately stored in the storage unit from the time series signal information. Furthermore, the partial time series signal information may be transferred to the partial image reconstructing unit for the purpose of the calculating process using the partial image reconstructing unit.

The partial image reconstructing unit is an element configured to extract or reconstruct information associated with the images (the emitted light intensities or the like) of the portions of the object to be observed from the partial time series signal information. The partial time series signal information is the time series signal information in the partial regions. Thus, information f associated with the light intensities in the regions can be obtained. The information associated with the images (the emitted light intensities or the like) of the portions of the object to be observed may be appropriately stored in the storage unit. Furthermore, the information associated with the images (the emitted light intensities or the like) of the portions of the object to be observed may be transferred to the image reconstructing unit for the purpose of the calculating process using the image reconstructing unit.

The image reconstructing unit is an element configured to reconstruct the image associated with the object to be observed using the images of the portions of the object to be observed reconstructed by the partial image reconstructing unit. The images of the portions of the object to be observed are images regions of the object to be observed. Thus, the image associated with the object to be observed can be reconstructed by matching the images.

Figure 3:
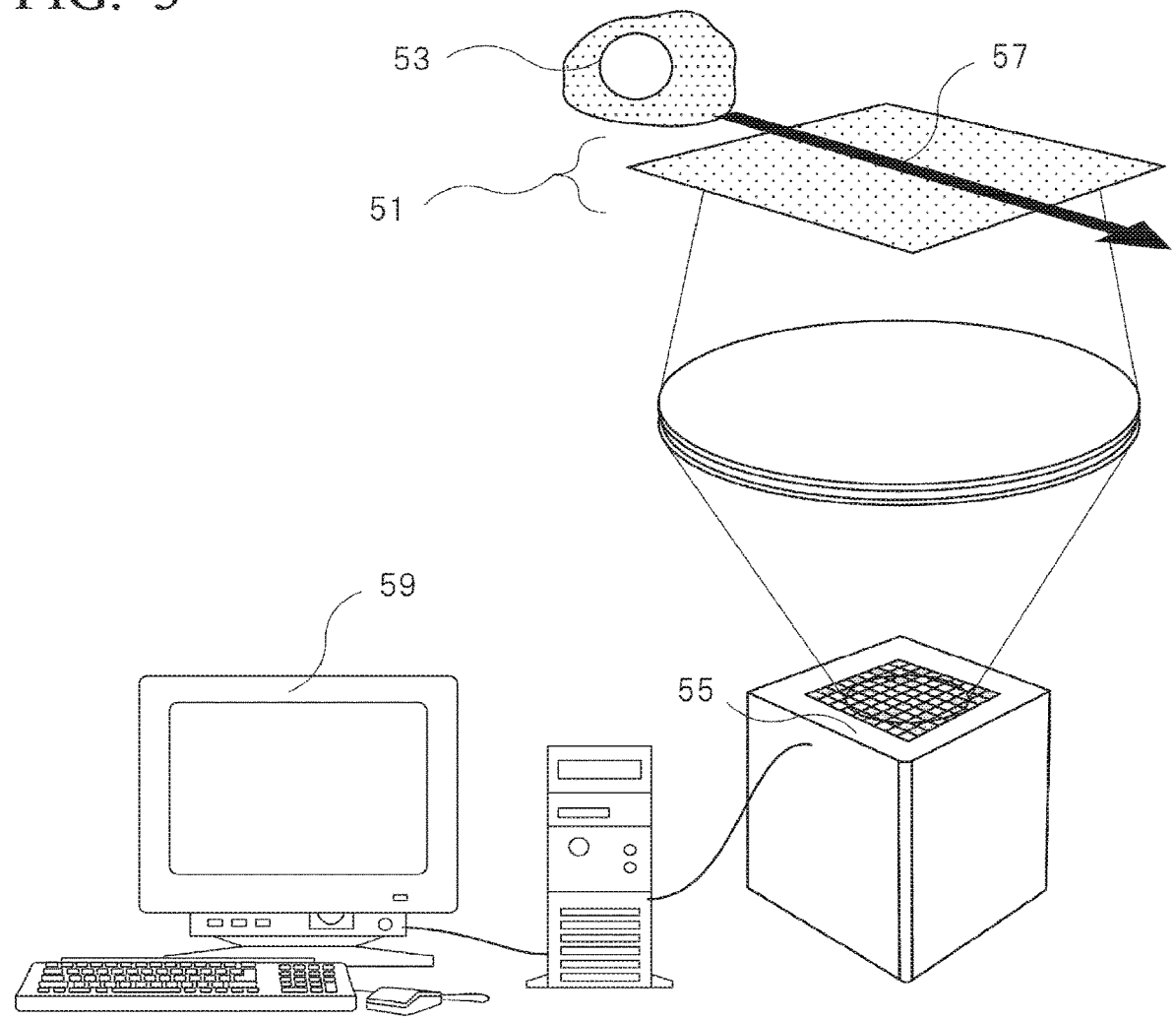
FIG. 3 is a schematic constitution diagram showing that an object to be observed moves in a second embodiment of an imaging device.
Figure 4:
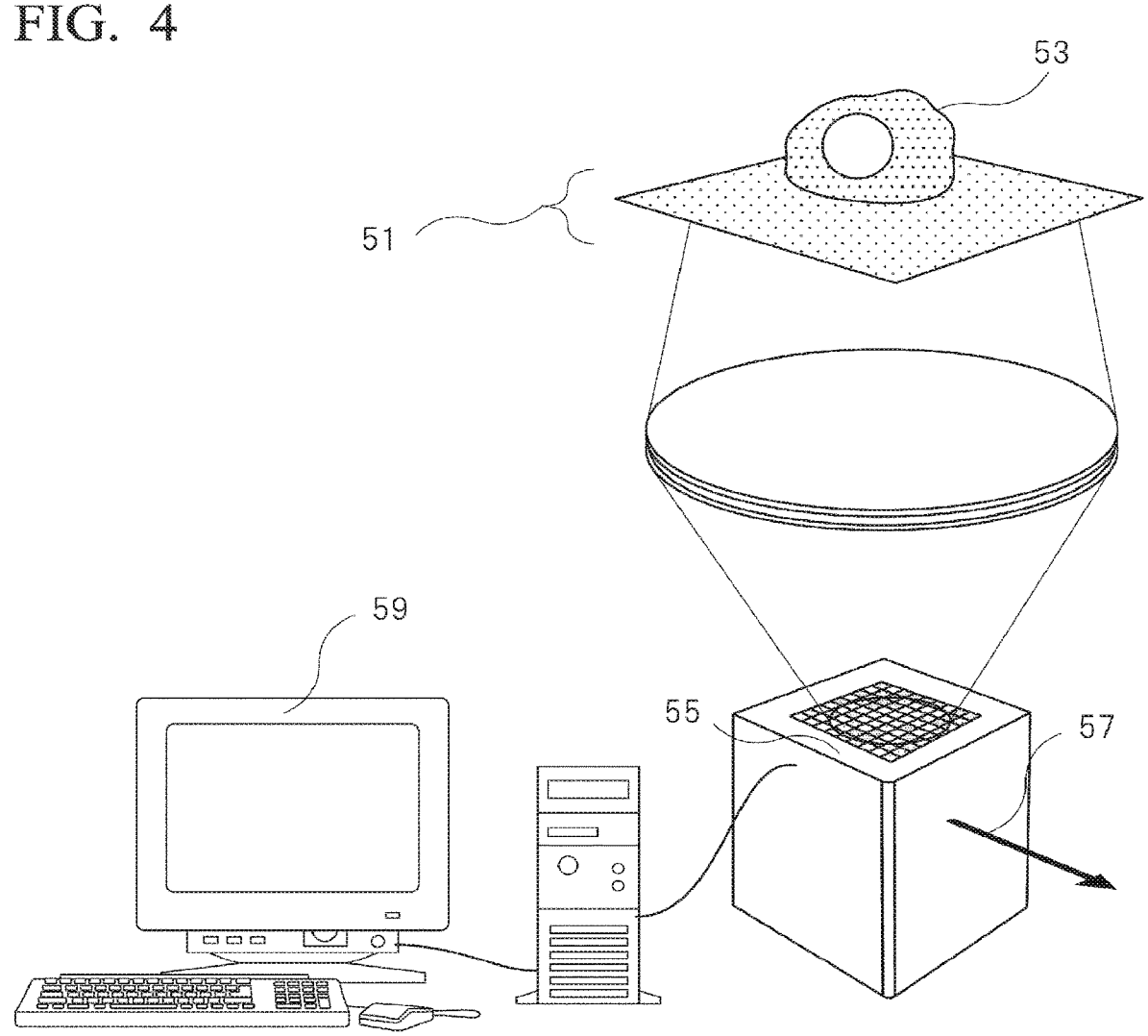
FIG. 4 is a schematic constitution diagram showing that the object to be observed moves in the second embodiment of the imaging device.

An imaging device of a second embodiment relates to one or a small number of pixel detectors 55 having a plurality of regions with different light transmission performance. FIG. 3 is a schematic constitution diagram showing that an object to be observed moves in the second embodiment of the imaging device. As shown in FIG. 3, the imaging device has an optical system 51, one or a small number of pixel detectors 55, a relative position control mechanism 57, and an image reconstructing unit 59. As long as a well-known optical system can irradiate the object to be observed with light, the well-known optical system can be used as the optical system 51. The optical system 11 of the above-described first embodiment of the imaging device may be used.

The one or a small number of pixel detectors 55 are elements configured to detect optical signals emitted by an object to be observed 53 receiving light discharged from the optical system 51. The one or a small number of pixel detectors 55 have sites having a plurality of regions with different light transmission performance in addition to the one or a small number of pixel detectors 15 in the above-described first embodiment of the imaging device. The plurality of regions with different light transmission performance may be configured using, for example, light filters present before a detecting unit. Such light filters have a plurality of regions with different light transmission performance. The plurality of regions may be divided, for example, in a lattice shape, and the lattice may be divided such that light transparency is divided into two stages or more.

The relative position control mechanism 57 is a mechanism configured to change relative positions between the optical system 51 and the object to be observed 53 and relative positions between the object to be observed 53 and the one or a small number of pixel detectors 55. Examples of the relative position control mechanism 57 is a mechanism configured to change a position of the object to be observed 53 or a mechanism configured to change positions of the one or a smaller number of pixel detectors 55. The mechanism configured to change a position of the object to be observed 53 can be used for, for example, cell flow cytometry, embedded micro-flow cytometry, and a wearable device. The imaging device having the mechanism configured to change the positions of the one or a small number of pixel detectors 55 can be used as, for example, an imaging device mounted in a displaceable portion (for example, a vehicle or wheels of a vehicle).

The image reconstructing unit 59 is an element configured to reconstruct an image of the object to be observed using optical signals detected by the one or a small number of pixel detectors 55. The image reconstructing unit 19 in the above-described first embodiment of the imaging device may be used as the image reconstructing unit 59. Examples of the image reconstructing unit 59 include an image reconstructing unit configured to reconstruct the image of the object to be observed using fluorescence detected by the one or a small number of pixel detectors 55 and information associated with a plurality of regions included in the one or a small number of pixel detectors 57.

Next, an example of an operation of the imaging device of the present invention will be described.

Figure 5:
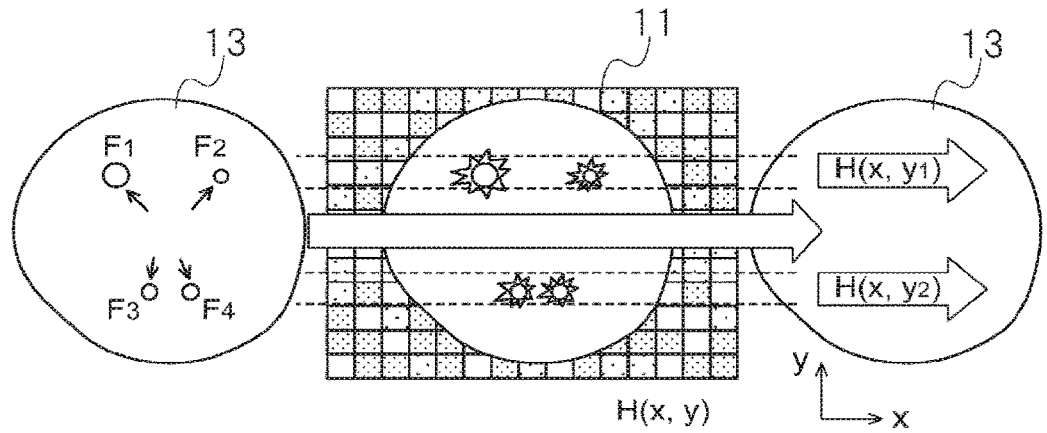
FIG. 5 is a conceptual diagram showing that an object to be observed passes through patterned lighting.

FIG. 5 is a conceptual diagram showing that an object to be observed passes through patterned lighting. As shown in FIG. 5, an object to be observed 13 is moved by a relative position control mechanism and the patterned lighting passes through an optical system. The object to be observed 13 has optical spatial information, for example, fluorescence molecules represented as $F_1$ to $F_4$. Furthermore, the fluorescence molecules may not emit fluorescence depending on a received intensity of light or have different intensities of emitted fluorescence. In other words, in this example, the fluorescence molecules represented as $F_2$ first emit fluorescence and the emitted light intensity is affected by the patterned lighting through which light passes. Light from the object to be observed 13 may be appropriately focused through lenses or the like. Furthermore, the light from the object to be observed 13 is transferred to the one or a small number of pixel detectors. In an example of FIG. 5, a progressing direction of the object to be observed is set to an x axis and a y axis is provided in a direction perpendicular to the x axis which is on the same plane as the x axis. In this example, $F_1$ and $F_2$ which have the same y coordinates are observed as fluorescence on $y_1$ (which is denoted as H(x, $y_1$)). Furthermore, $F_3$ and $F_4$ which have the same y coordinates are observed as fluorescence on $y_2$ (which is denoted as H(x, $y_2$)).

Figure 6:
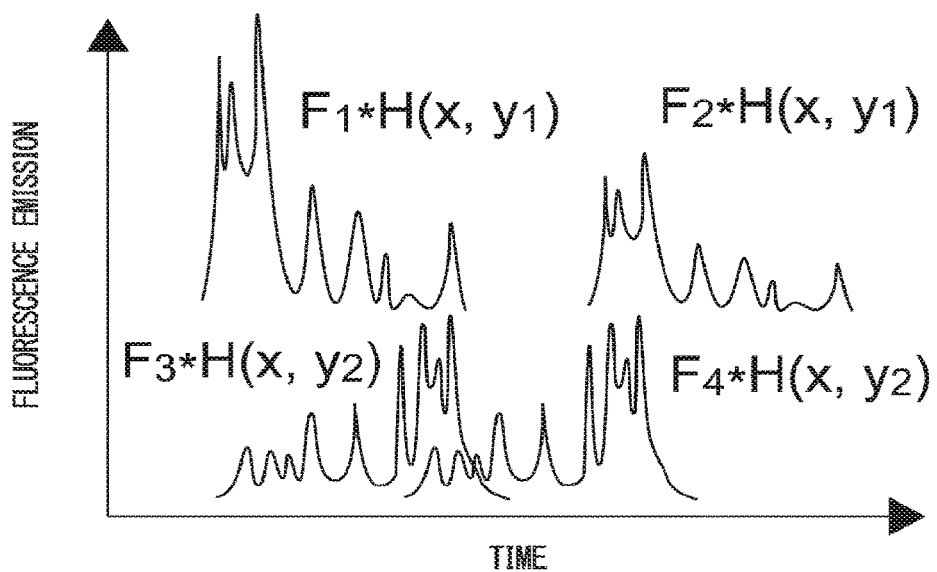
FIG. 6 is a conceptual diagram showing states of fluorescence emitted by the object to be observed shown in FIG. 5.

FIG. 6 is a conceptual diagram showing states of the fluorescence emitted by the object to be observed shown in FIG. 5. As shown in FIG. 6, the fluorescence is caused to be emitted from the fluorescence molecules, and for example, $F_1$ and $F_2$ experience the same lighting pattern. Thus, $F_1$ and $F_2$ are considered as having a similar time response pattern or output pattern. On the other hand, it is conceivable that $F_1$ and $F_2$ may have different emitted light intensities. For this reason, the emitted light intensities of $F_1$ and $F_2$ can be approximated to a product of $F_1$ and $F_2$ serving as coefficients specific to molecules emitting light and H(x, $y_1$) serving as a time response pattern with the same $y_1$ coordinates. The same applies to $F_3$ and $F_4$.

Figure 7:
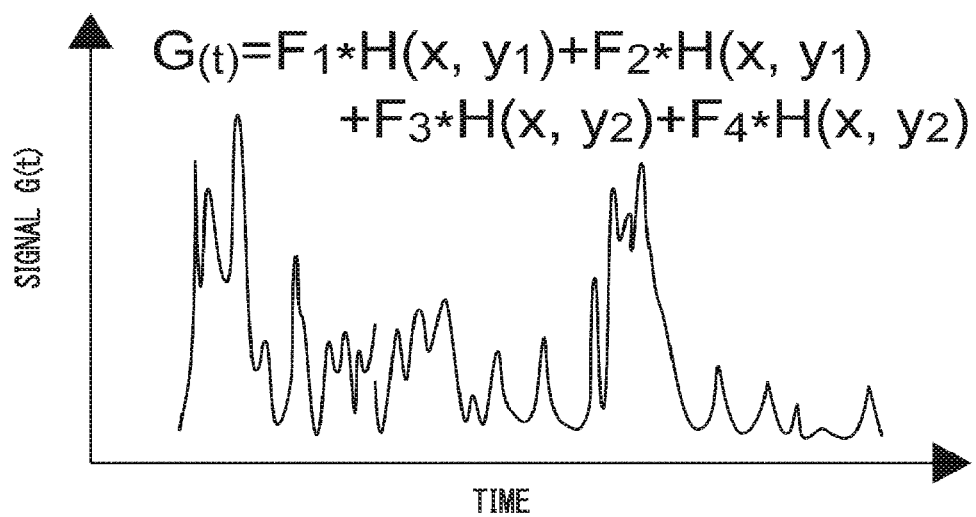
FIG. 7 is a conceptual diagram showing a detection signal when the fluorescence emitted by the object to be observed shown in FIG. 5 has been detected.

FIG. 7 is a conceptual diagram showing a detection signal when the fluorescence emitted by the object to be observed shown in FIG. 5 has been detected. The detection signal is observed as sum signals of the fluorescence signals shown in FIG. 6. The signal include a temporal change pattern of a plurality of intensities H(x, $y_n$). Coordinates and fluorescence coefficients (fluorescence intensities) at the coordinates can be obtained from a detection signal intensity (G(t)) and H(x, $y_n$).

Figure 8:
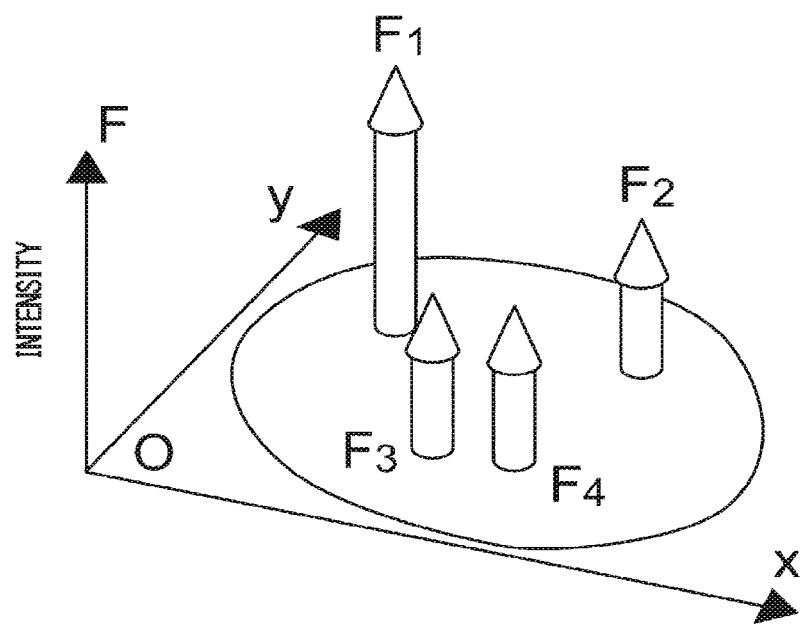
FIG. 8 is a conceptual diagram showing positions of fluorescence molecules and fluorescence intensities obtained from detection signal intensities.

FIG. 8 is a conceptual diagram showing positions of fluorescence molecules and fluorescence intensities obtained from the detection signal intensities. As shown in FIG. 8, the fluorescence coefficients (the fluorescence intensities) $F_1$ to $F_4$ can be obtained from the detection signal G(t).

Figure 9:
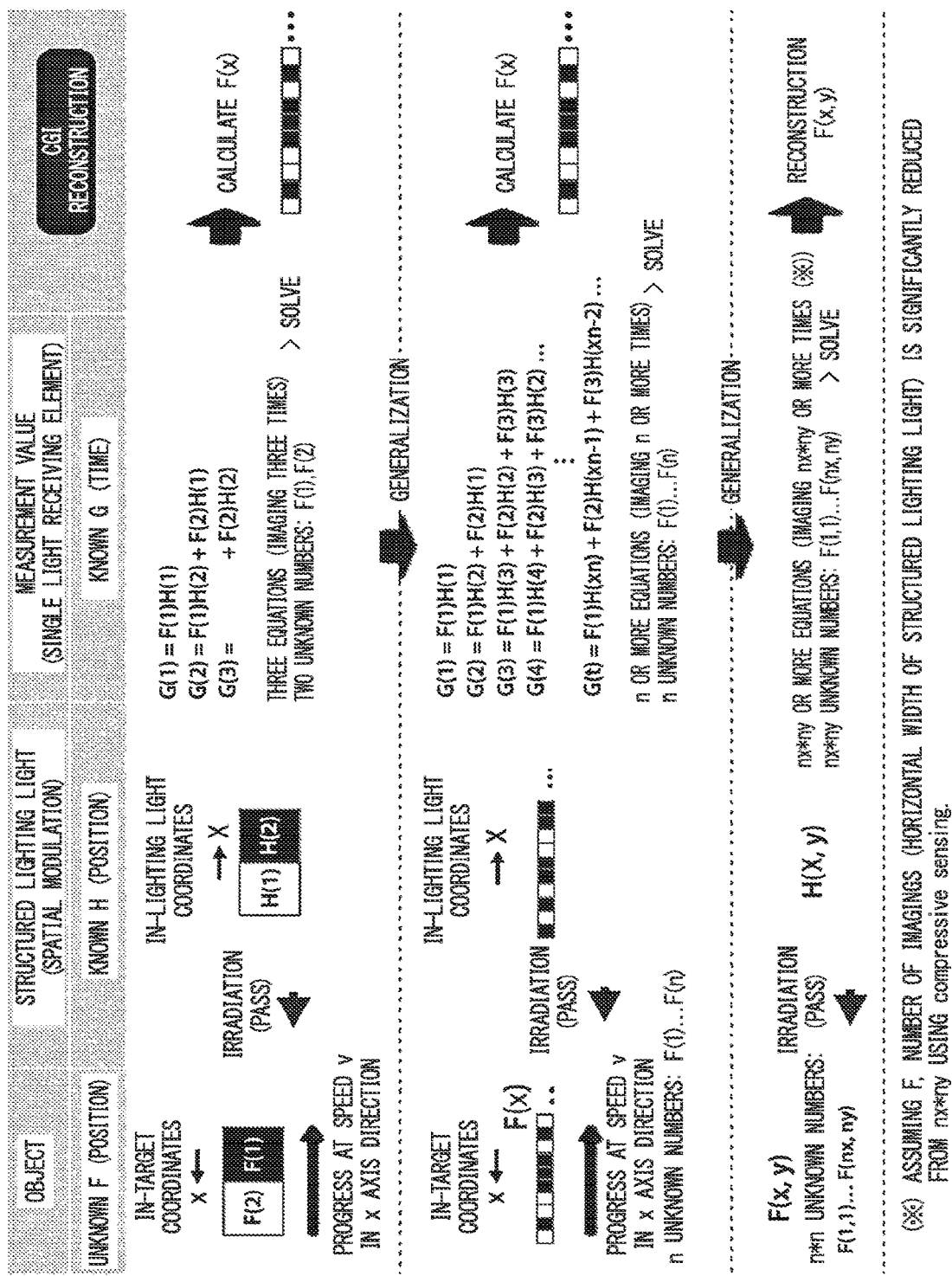
FIG. 9 is a view showing an image reproduction principle.

The above-described principle will be described in greater detail. FIG. 9 is a view showing an image reproduction principle. For example, it is assumed that there are F(1) and F(2) as in-target coordinates. Furthermore, at time 1, F(1) is irradiated with light of a first pattern and F(2) is not irradiated with light of the first pattern. At time 2, F(1) is irradiated with light of a second pattern and F(2) is irradiated with light of the first pattern. At time 3, F(2) is not irradiated with light and F(2) is irradiated with light of the second pattern. Thus, the detection signal G(t) is as follows. G(1) =F(1)H(1), G(2)=F(1)H(2)+F(2)H(1), and G(3)=F(2)H(2). Solving this, F(1) and F(2) can be analyzed. If this principle is used, analysis is similarly performed even if the number of in-target coordinates is higher, and thus F(1) and F(n) can be obtained.

Subsequently, when an object is in two dimensions, internal coordinates of the object to be observed are set to F(x,y). On the other hand, patterned lighting is also set as having the same coordinates. If an x axis direction is set to be n and a y axis direction is set to be n in the internal coordinates of the object to be observed, the number of unknown numbers of F(x,y) is n×n. Signals are measured as described above and an obtained signal G(t) is analyzed so that F(x,y) (0≤x≤n and 0≤y≤n) can be reconstructed.

Figure 10:
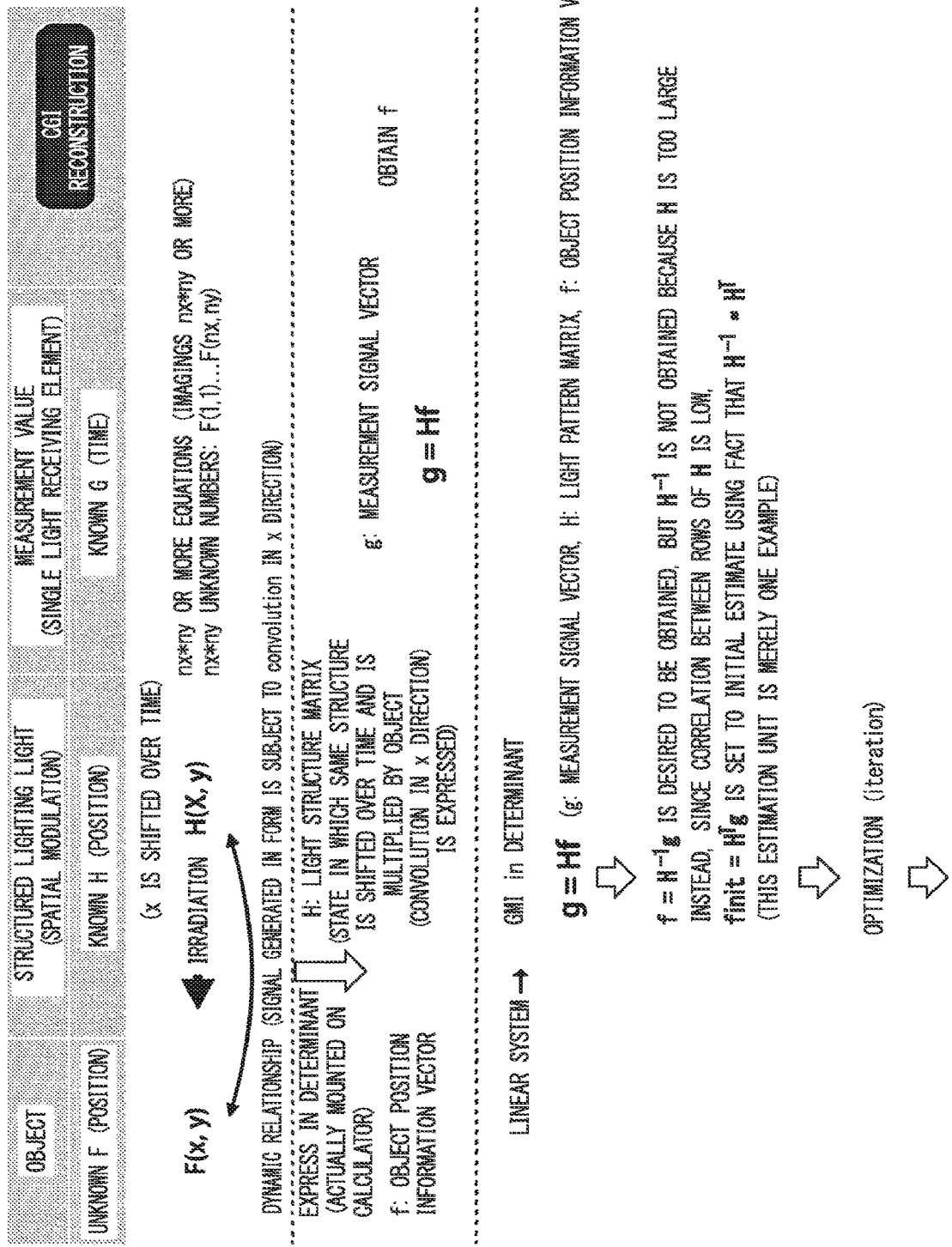
FIG. 10 is a view showing an example of an image reproducing process.

FIG. 10 is a view showing an example of an image reproducing process. In this example, an image is expressed by a determinant as f (an object position information vector). Furthermore, the patterned lighting is expressed as H(X,y) and X is represented by a variable varying over time.

Detection signal intensities are expressed as g (a measurement signal vector). Thus, the detection signal intensities can be expressed as g=Hf. As shown in FIG. 10, both sides may be multiplied by an inverse matrix $H^{-1}$ of H to obtain f. On the other hand, the inverse matrix $H^1$ of H may not be easily obtained in some cases when H is too large. In this case, for example, a transposed matrix $H^1$ of H may be used in place of the inverse matrix. An initial estimated value $f_{int}$ for f can be obtained using this relationship. After that, f is optimized using the initial estimation value $f_{int}$ for f so that the image of the object to be observed can be reproduced.

In other words, FIG. 10 is a view showing an example of an image reproducing process. In this example, an image is expressed by a determinant as f (the object position information vector). Furthermore, the patterned lighting is expressed as H(X,y) and X is presented by a variable varying over time. Detection signal intensities are expressed as g (the measurement signal vector). Thus, the detection signal intensities can be expressed as g=Hf. As shown in FIG. 10, both sides may be multiplied by an inverse matrix $H^{-1}$ of H to obtain f. On the other hand, the inverse matrix $H^{-1}$ of H may not be easily obtained in some cases when H is too large. In this case, for example, the initial estimation value $f_{init}$ for f can be obtained as results of multiplication between the transposed matrix $H^1$ of H and g. After that, f is optimized using the initial estimation value $f_{init}$ for f so that the image of the object to be observed can be reproduced.

Figure 11:
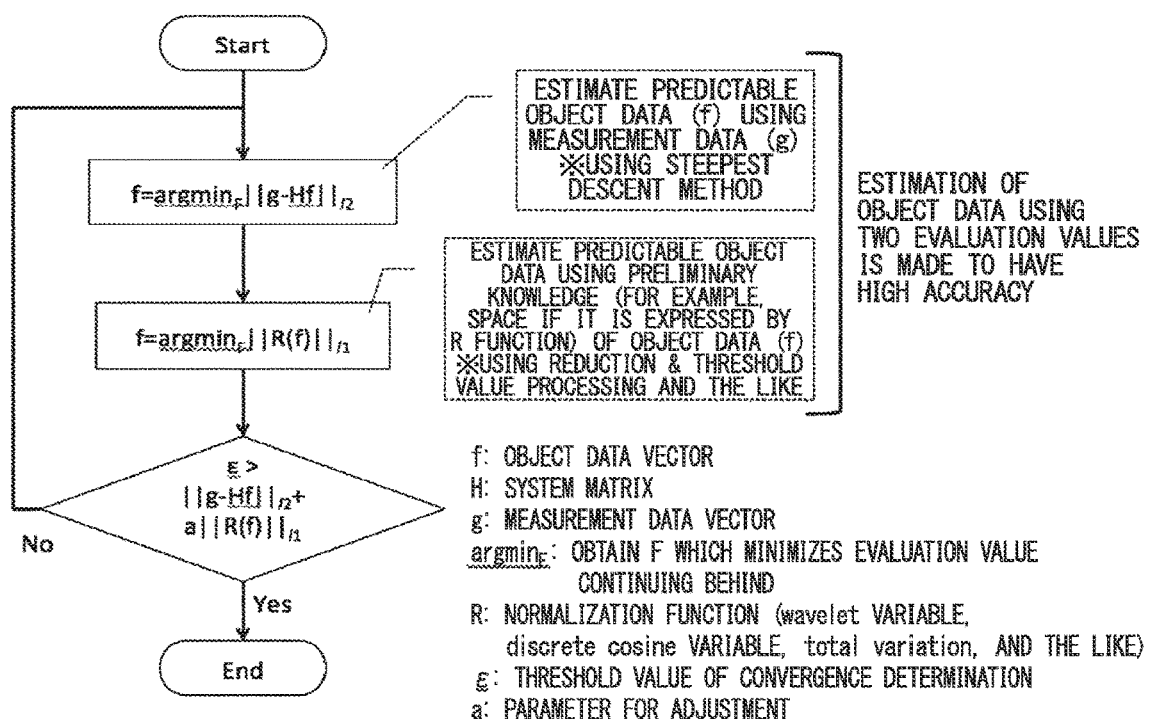
FIG. 11 is a flowchart showing an example of an image reconstructing process.
Figure 13:
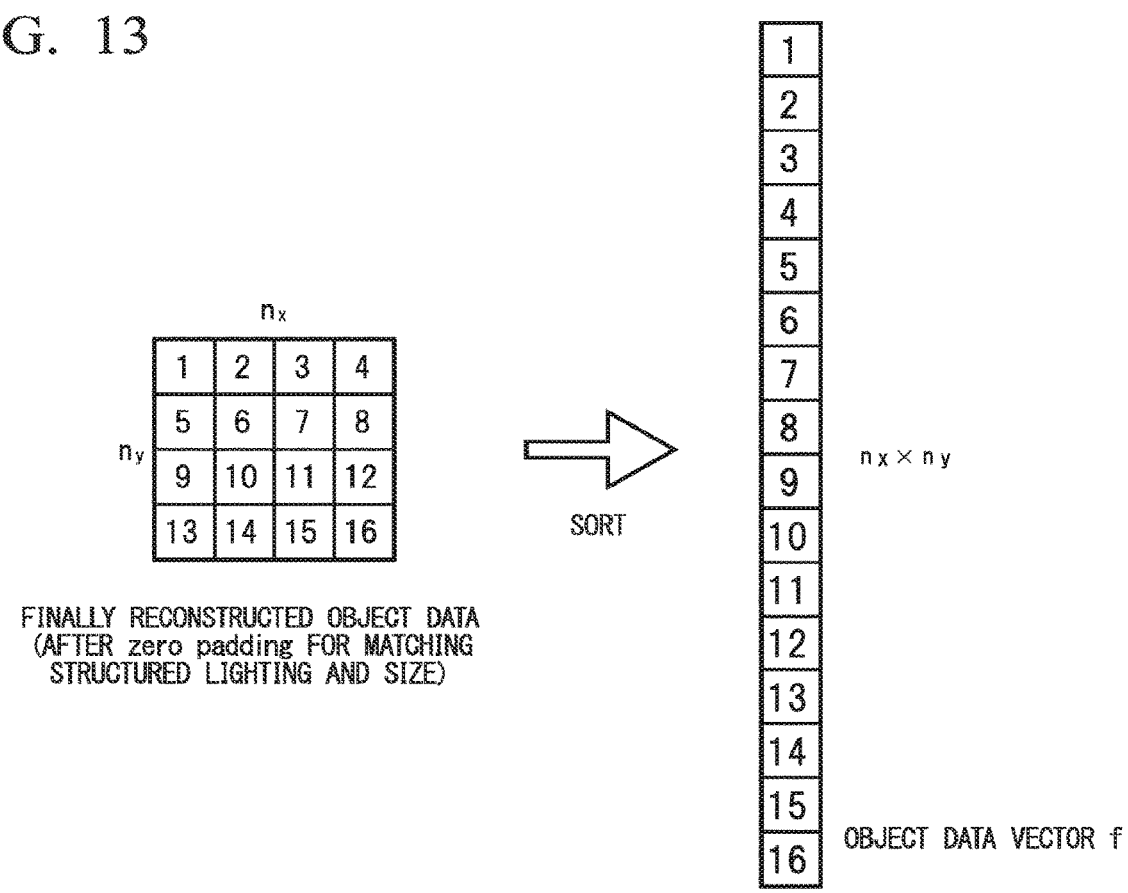
FIG. 13 is a view showing a constitution of a target data vector f.

FIG. 11 is a flowchart showing an example of an image reconstructing process. FIG. 12 is a view showing a matrix H. FIG. 13 is a view showing a constitution of a target data vector f.

Imaging devices associated with another embodiment of the present invention can similarly reproduce an image of an object to be observed by applying the above-described principle.

Figure 14:
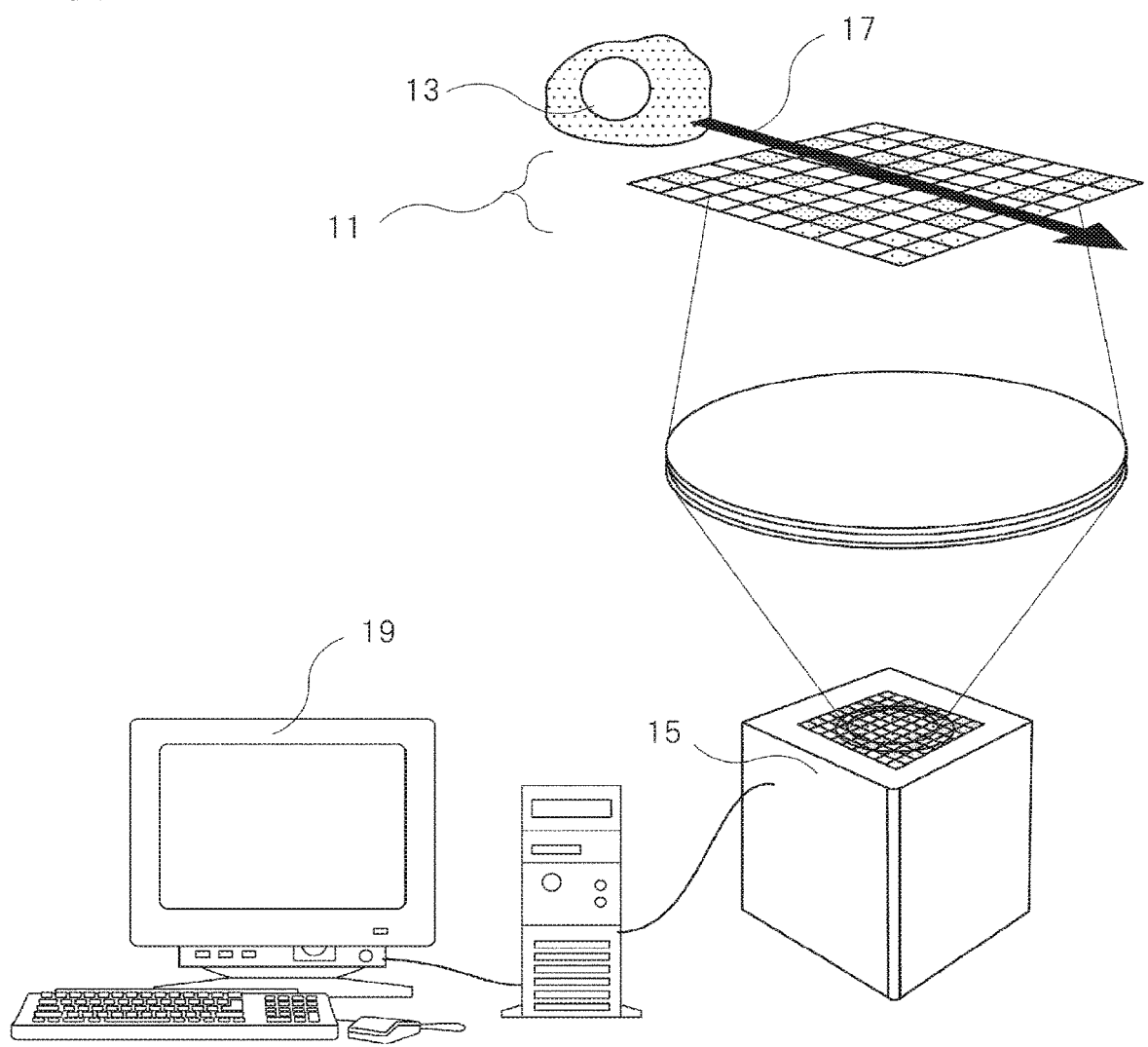
FIG. 14 is a schematic diagram showing an embodiment of an imaging device of the present invention.

FIG. 14 shows another embodiment of the imaging device of the present invention. The imaging device includes sites having a plurality of regions with different light transmission performance on one or a small number of pixel detectors in the imaging device of FIG. 1. The imaging device can distribute burdens on a lighting side and a sensor side. For this reason, characteristics which have not been observed in the related art among characteristics of an object such as observation of a distribution process can be observed.

Figure 15:
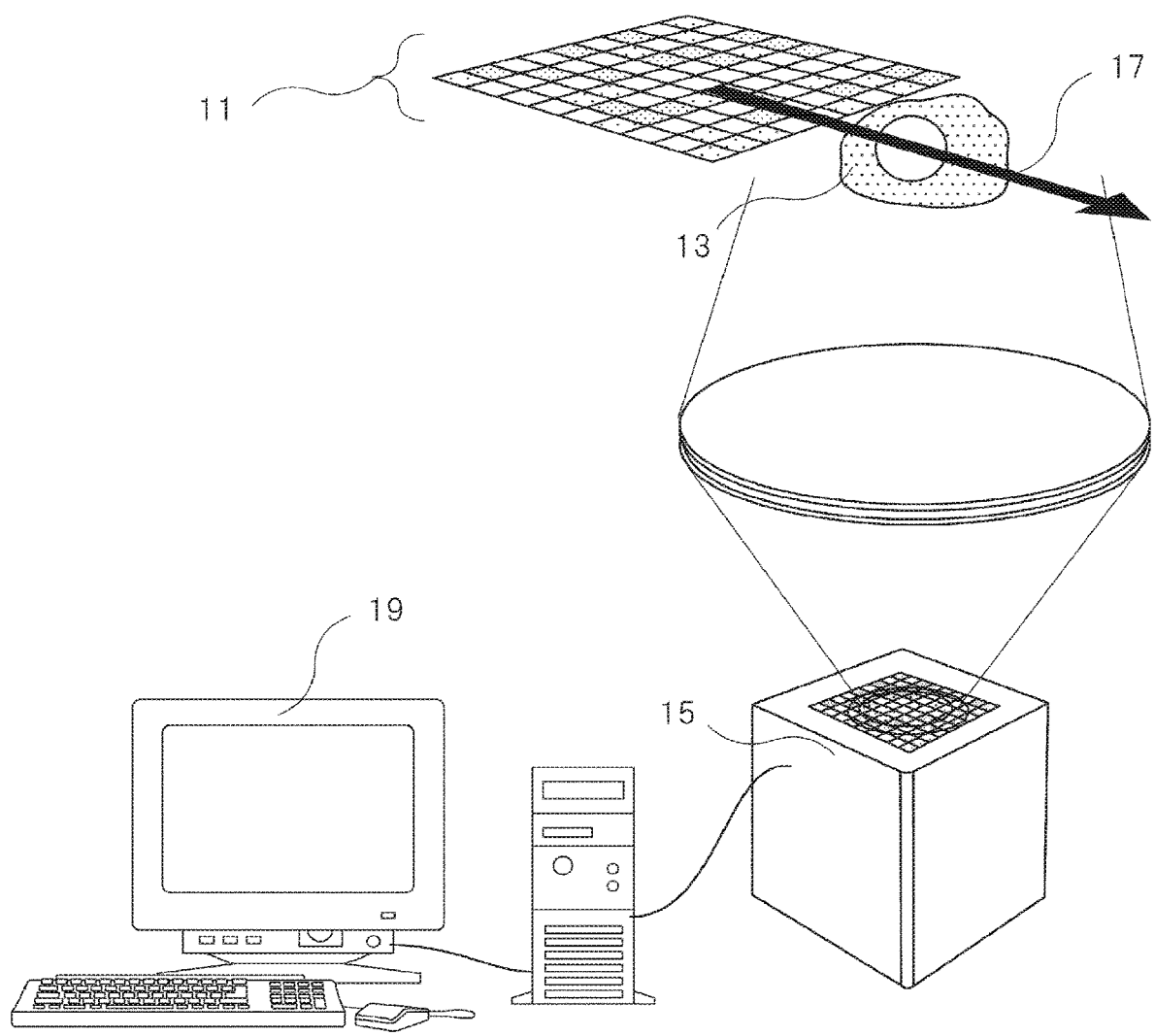
FIG. 15 is a schematic diagram showing an embodiment of an imaging device of the present invention.

FIG. 15 shows another embodiment of the imaging device of the present invention. The imaging device includes sites having a plurality of regions with different light transmission performance on one or a small number of pixel detectors in the imaging device of FIG. 2. The imaging device can distribute burdens on a lighting side and a sensor side. For this reason, for example, characteristics which have not been observed in the related art among characteristics of an object such as observation of a distribution process can be observed.

Next, compressive sensing will be described.

Optical characteristics of a structured lighting pattern used by the imaging device are set to have different random distributions for every pixel so that the number of times of sampling is reduced and information necessary for reconstructing an image of an object to be observed is acquired. In other words, the number of times of sampling is reduced and the image of the object to be observed is reconstructed on the basis of scattered light obtained through a structured random lighting pattern and sparsity of the object to be observed.

To be specific, the imaging device ascertains a range of a size of the object to be observed by observing the object to be observed using the randomly distributed structured lighting pattern and performing reconstruction of the image a plurality of times. Subsequently, the range of the structured lighting pattern is reduced on the basis of the range of the size of the object to be measured to be able to cover a range necessary to reconstruct the image of the object to be observed. Alternatively, a region observed by the imaging device is expanded to match a region in which the object to be observed is present.

As described above, the imaging can improve throughput in image flow cytometry by designing the structured lighting pattern.

Note that the structured lighting pattern may be designed to have a delta function form in which autocorrelation between an optical structure and an optical structure itself becomes a state having a sharp peak. The autocorrelation of the optical structure is designed to have the delta function form so that the structured lighting pattern and detection signals when fluorescence emitted by the object to be observed has been detected are uniquely determined. Thus, the image of the object to be observed can be reconstructed.

Also, if the structured lighting pattern is designed to include many regions through which light is not transmitted, overlapping of the detection signals when the fluorescence emitted by the object to be observed has been detected increases, and thus imaging with a higher signal-to-noise (S/N) ratio can be performed.

Example 1

Next, the present invention will be described in detail using examples.

Figure 16:
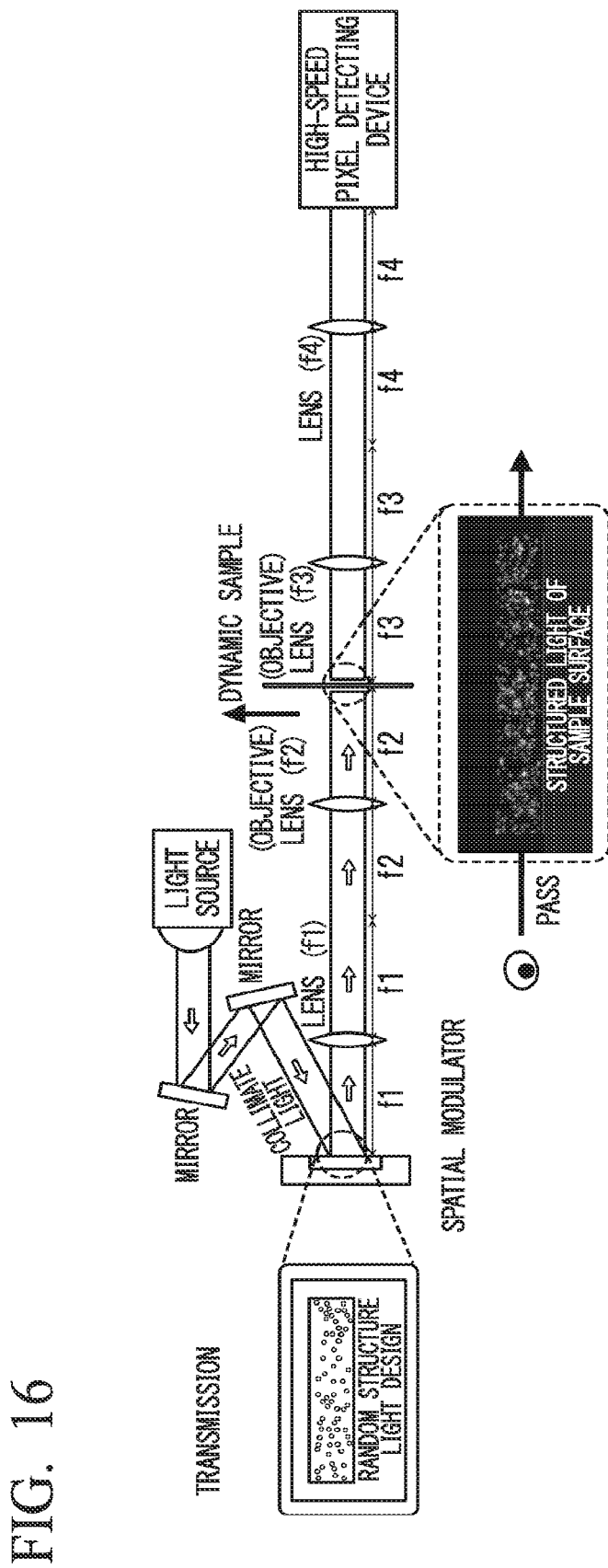
FIG. 16 is a schematic diagram of a device in Example 1.

FIG. 16 is a schematic diagram of a device in Example 1. The device relates to a device in which the object to be observed moves, an irradiation pattern through which light is radiated to the object to be observed is obtained using a light source and a mirror, and light transmitted through the object to be observed is observed so that an image of the object to be observed is reproduced.

An M470L3-C1/blue (a wavelength of 47 nm) Olympus BX & Collimator for IX LED (1000 mA) manufactured by Thorlabs, Inc. was used as a light source. Note that, unlike a case in which coherent light such as a laser is used, in the case in which non-coherent light such as a light emitting diode (LED) and a lamp was used, spots were not observed. Thus, accuracy was improved. In addition, a case in which continuous light was used was more appropriate for high speed imaging than a case in which pulsed light was used.

A silver mirror manufactured by Thorlabs, Inc. was used as the mirror. An optical axis of light incident on a spatial modulator was adjusted using the silver mirror. A Digital Micromirror Device (DMD) DLPLCR 9000 EVM manufactured by Texas Instruments was used. Light from the light source was structured in an optical system having a lighting pattern through the spatial modulator. Note that, although a DMD was used in this example, as long as a device can perform spatial modulation, light may be structured through a device other than a DMD. For example, an overhead projector (OHP) sheet obtained by performing printing thereon and changing light transparency thereof in accordance with the printing may be used and a transparent sheet with a microstructure may be used. Such lighting patterning is particularly preferably binary (light and dark) modulation. A spatial light modulator may be used to obtain the lighting pattern, but a problem such as zero order diffracted light occurs when a spatial light modulator is used.

Biconvex lenses manufactured by Thorlabs, Inc. were used as lenses. A 4f system was constructed using the lenses together with objective lenses and a structure on a spatial modulator was accurately optically transferred onto the object to be observed (a sample). A latter half (a rear side of the object to be observed) of the 4f system is not essentially important and it is sufficient if the latter half thereof can detect transmitted light from the sample with a good S/N.

An UPLSAPO20X manufactured by Olympus, Co. was used for the objective lenses. The objective lenses have a function of forming an image of structured lighting serving as patterned lighting on the object to be observed and a function of collecting optical signals from the object to be observed. The objective lenses preferably have a high numerical aperture (NA) and a wide field of view to form many more images of the structured lighting more finely.

An electric single axis stage HPS60-20x-SET and two rotary stages KSPB-906M-M6 which were manufactured by SIGMAKOKI, Co., LTD. were used as a sample stages for moving the object to be observed. An orientation of the object to be observed was three-dimensionally adjusted using the two rotary stages while the object to be observed was moved using the single axis stage.

An sCMOS camera Flash 4.0 manufactured by Hamamatsu Photonics K.K. was used as a sensor. A pixel value of a captured image using such a camera was integrated by a calculator and was set as a transmitted signal which could be obtained by a single pixel detector. Such a camera is for the purpose of a principle demonstration test and preferably uses one high-speed pixel or a small number of high-speed detecting elements.

Figure 17:
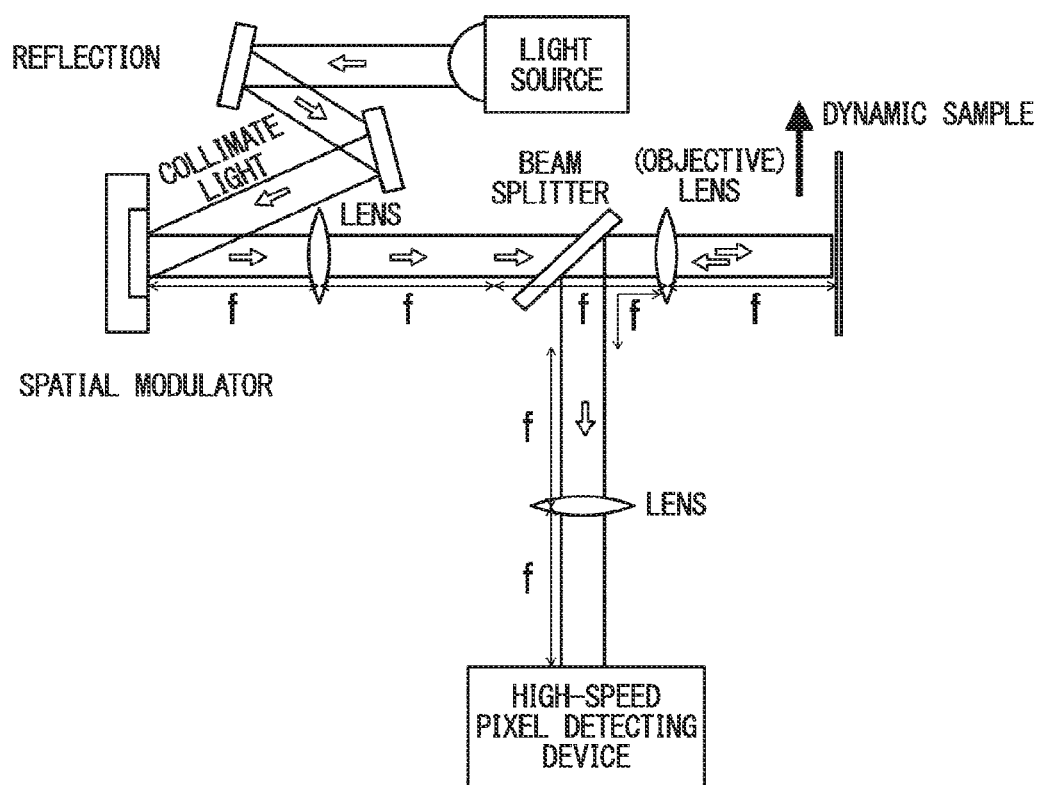
FIG. 17 is a schematic constitution diagram showing a constitution in which an image is reproduced by detecting reflected light from an object to be observed.
Figure 18:
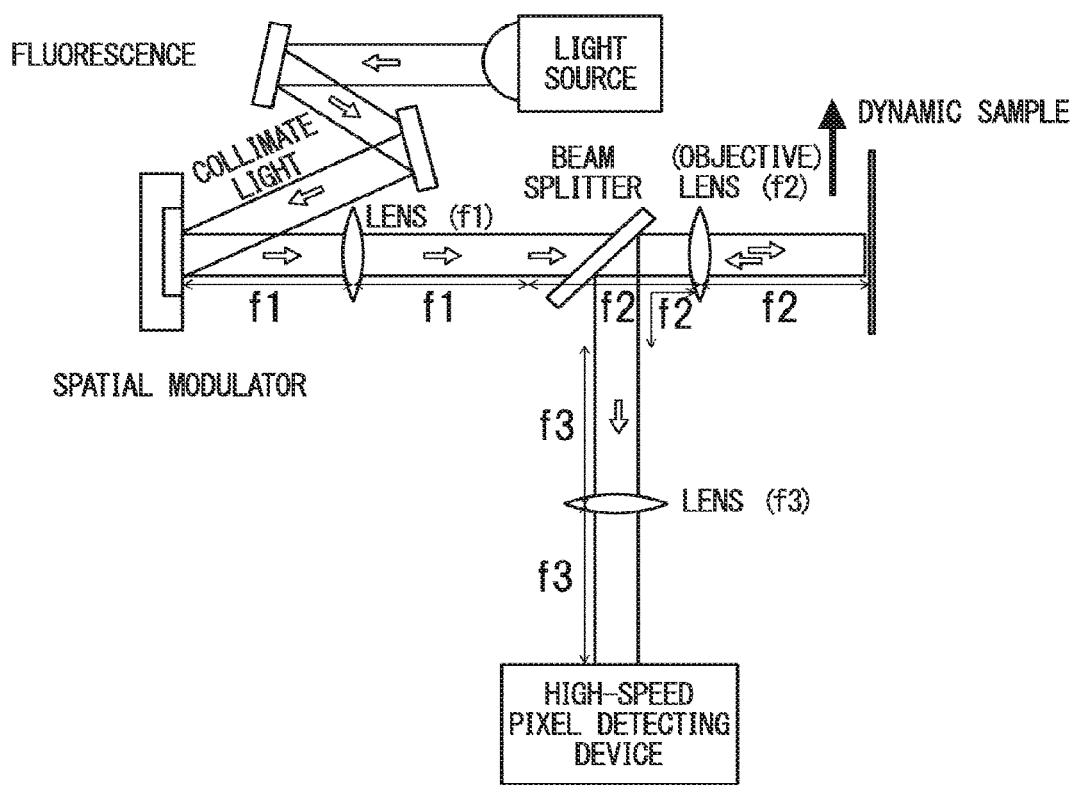
FIG. 18 is a schematic constitution diagram showing a constitution in which an image is reproduced by detecting fluorescence from an object to be observed.

FIG. 17 is a schematic constitution diagram showing a constitution in which an image is reproduced by detecting reflected light from an object to be observed. FIG. 18 is a schematic constitution diagram showing a constitution in which an image is reproduced by detecting fluorescence from an object to be observed.

Figure 19:
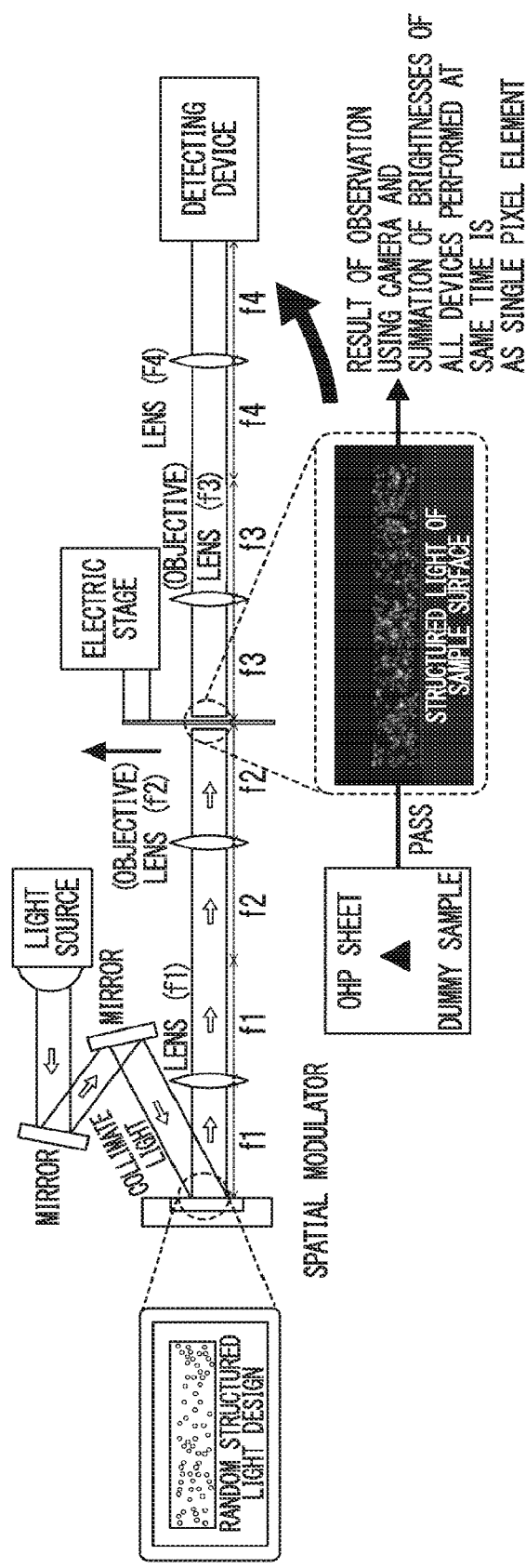
FIG. 19 is a view showing imaging when an overhead projector (OHP) sheet with a black triangle printed thereon is used as an object to be observed and the sheet is moved.
Figure 20:
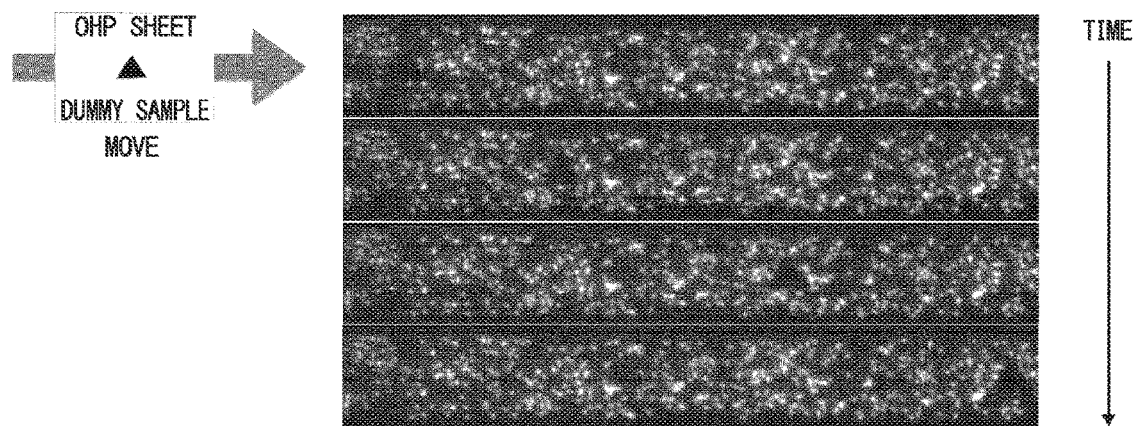
FIG. 20 shows detection results observed at time intervals. Going from top to bottom indicates elapse of time.
Figure 21:
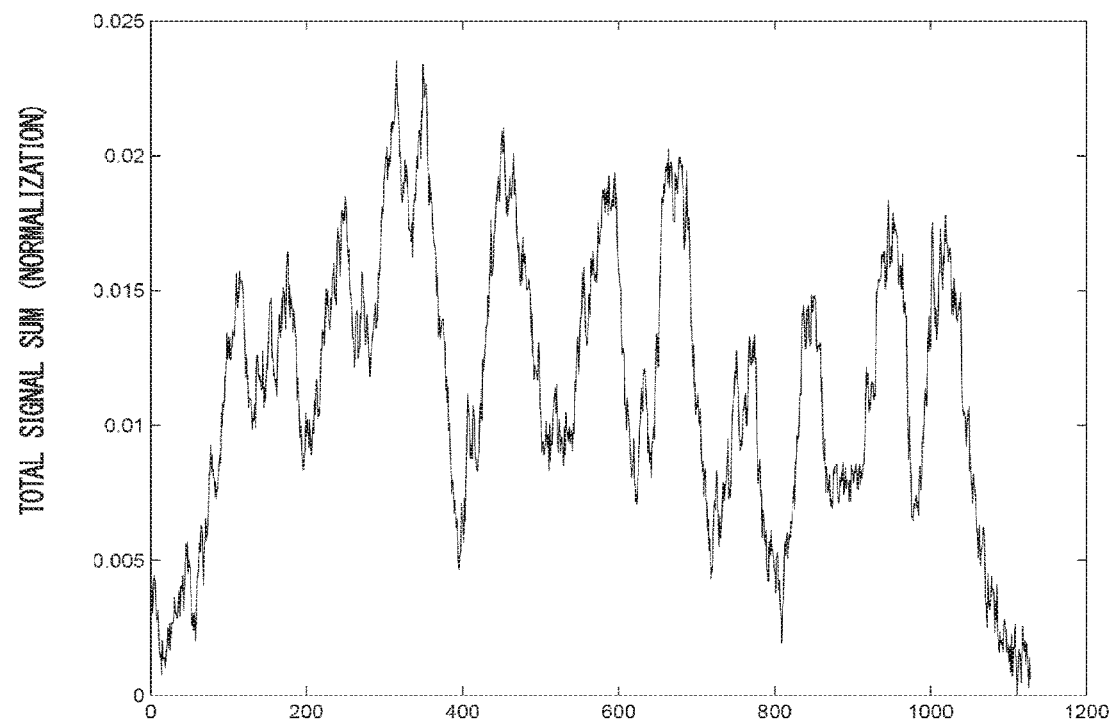
FIG. 21 is a graph showing change over time in a total amount of light of optical signals obtained when an object to be observed has passed through patterned lighting.
Figure 22:
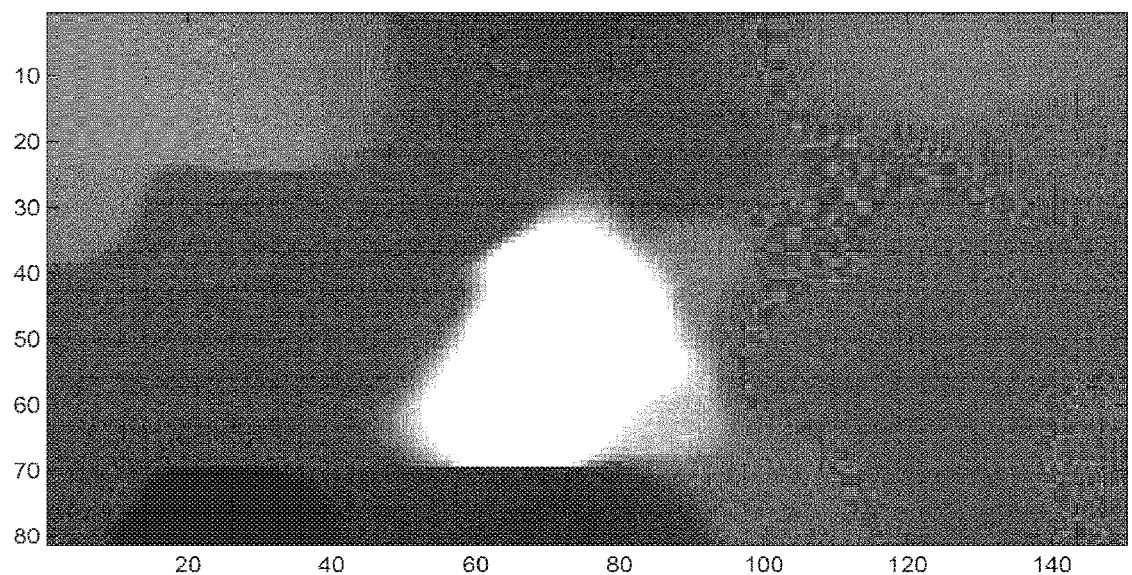
FIG. 22 is an image of the object to be observed reconstructed from the graph of FIG. 21.

FIG. 19 is a view showing imaging when an OHP sheet with a black triangle printed thereon is used as an object to be observed and the sheet is moved. FIG. 20 shows detection results observed at time intervals. Going from top to bottom indicates elapse of time. In a topmost detection result, a black triangle is present at a left part. Furthermore, a position of the black triangle moves in a rightward direction in observation results in portions below. From this, it can be seen that, if the object to be observed moves, a discharged signal can be detected in accordance with displacement thereof. FIG. 21 is a graph showing a temporal change of a total amount of light of optical signals obtained when an object to be observed has passed through patterned lighting. FIG. 22 is an image of the object to be observed reconstructed from the graph of FIG. 21. From FIG. 22, it was shown that an image can be reproduced so that the shape of the object to be observed can be ascertained.

Example 2

Next, multicolor imaging will be described. The multicolor imaging is technology in which an object to be observed stained in multiple colors using a plurality of cell fluorescent labels is observed using a combination of a plurality of optical elements so that a color image is reconstructed. Note that the object to be observed is not limited to cells. Furthermore, light to be observed is not limited to fluorescence. A technique of dying an object to be observed is not limited to a cell fluorescent label and may use dyes or the like. The object to be observed through the multicolor imaging is not limited to a stained object to be observed and may be a colored object to be observed.

Multi-color imaging of cells of which cell nuclei, cytoplasm, cell membranes, or the like are stained in multiple colors, which has been performed in fluorescence activated cell sorting (FACS) in the related art, can be performed using a combination in which a plurality of cell fluorescent labels, dichroic mirrors, achromatic lenses, or band pass filters is further added to the above-described device shown in Example 1. Note that emitted fluorescence light from multicolor-stained cells may be spectrally dispersed using optical elements such as diffraction elements instead of dichroic mirrors. In other words, various elements using refraction or diffraction can be used in spectroscopy for the purpose of multi-color imaging.

To be specific, a device shown in Example 2 reconstructs an image of cell membranes fluorescently stained red, an image of cytoplasm fluorescently stained green, and an image of cell nuclei fluorescently stained blue. Subsequently, the device shown in Example 2 can generate an image of multicolor-stained cells by overlapping the reconstructed images. The image of the multicolor-stained cells generated by the device shown in Example 2 is not inferior in comparison with an image of multicolor-stained cells captured using a camera capable of performing color imaging.

Note that, so far, as an example of the imaging device, although the device in which any one or both of the optical system with the structured lighting pattern and the structured detecting system having the plurality of regions with different optical characteristics is used, the optical signals from the object to be observed is detected through the one or a small number of pixel detectors while changing the object to be observed and the relative position of any one of the above-described optical system and detecting system, the time series signal information of the optical signals is obtained, and the image associated with the object to be observed is reconstructed from the time series signal information has been described, the present invention is not limited thereto. In other words, an imaging device is sufficient if the imaging device can acquire the above-described time series signal information of the optical signals and it is not essential to reconstruct the image associated with the object to be observed from the time series signal information.

INDUSTRIAL APPLICABILITY

The present invention basically belongs to the field of optical devices, but can be used in various fields such as medical devices and wearable devices.

REFERENCE SIGNS LIST

11 Optical system with structured lighting pattern
13 Object to be observed
15 One or small number of pixel detectors
17 Relative position control mechanism
19 Image reconstructing unit
51 Optical system
53 Object to be observed
55 One or a small number of pixel detectors
57 Relative position control mechanism
59 Image reconstructing unit

What is claimed is:

1. A method for obtaining time series optical signal corresponding to an object, comprising:
   (a) providing an optical system by which an object to be observed is illuminated by a structured lighting pattern, wherein the optical system comprises at least one light source providing continuous light;
   (b) changing a position or an orientation of the object such that a plurality of regions of the object is sequentially illuminated by the structured lighting pattern;
   (c) using at least one detector to sequentially detect at least one optical signal from said object, wherein the at least one optical signal sequentially detected by the at least one detector comprises compressed image information corresponding to the object.

2. The method of claim 1, wherein in (b), the position or the orientation of the object is changed (i) by moving a stage on which the object is disposed or (ii) using cell flow cytometry.

3. The method of claim 1, wherein the at least one light source in the optical system comprises a group of light sources configured to generate the structured lighting pattern.

4. The method of claim 1, wherein the optical system further comprises at least one optical element, wherein the at least one light source is configured to provide a light through the at least one optical element, thereby generating the structured lighting pattern.

5. The method of claim 4, wherein the at least one optical element is selected from the group consisting of an optical modulator, a light filter, and a film.

6. The method of claim 4, wherein the at least one optical element comprises a plurality of regions of different optical characteristics, and wherein the structured lighting pattern is imparted by the different optical characteristics of the at least one optical element.

7. The method of claim 6, wherein the different optical characteristics comprises one or more members selected from the group consisting of a light intensity, a light wavelength, and a light polarization.

8. The method of claim 1, wherein the at least one optical signal comprises one or more members selected from the group consisting of fluorescence, emitted light, transmitted light, and reflected light.

9. The method of claim 8, wherein the at least one detector is configured to detect the at least one optical signal of fluorescence from the object which is stained in multiple colors using a plurality of fluorescent labels.

10. The method of claim 1, further comprising reconstructing at least one time-independent image associated with the object from the at least one optical signal.

11. The method of claim 4 or 5, wherein the light from the at least one light source is white light or monochromatic light.

12. The method of claim 1, wherein the at least one detector comprises a single pixel detector.

13. The method of claim 1, wherein the at least one detector comprises a small number pixel detector.

14. The method of claim 1, wherein the structured lighting pattern is provided by a binary modulation.

15. The method of claim 14, wherein the binary modulation is light and dark modulation, wherein the structured lighting pattern comprises a plurality of regions of light and a plurality of regions of dark.

16. The method of claim 1, wherein the structured lighting pattern is provided by a randomly distributed structured lighting pattern.

17. The method of claim 16, wherein the method further comprises adjusting a range of the structured lighting pattern, wherein the range is reduced or expanded to cover a size of the object.

* * * * *